United States Patent
Shin et al.

(10) Patent No.: US 11,552,133 B2
(45) Date of Patent: Jan. 10, 2023

(54) ELECTRONIC DEVICE INCLUDING DISPLAY AND CAMERA

(71) Applicant: SAMSUNG ELECTRONICS CO., LTD., Suwon-si (KR)

(72) Inventors: Sungyoung Shin, Suwon-si (KR); Minsuk Uhm, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 99 days.

(21) Appl. No.: 17/220,313

(22) Filed: Apr. 1, 2021

(65) Prior Publication Data

US 2021/0351236 A1 Nov. 11, 2021

(30) Foreign Application Priority Data

May 11, 2020 (KR) .......................... 10-2020-0056215

(51) Int. Cl.
*H01L 51/00* (2006.01)
*H01L 51/52* (2006.01)
(Continued)

(52) U.S. Cl.
CPC ........ *H01L 27/322* (2013.01); *H01L 27/3234* (2013.01); *H01L 51/5253* (2013.01);
(Continued)

(58) Field of Classification Search
CPC . H01L 27/322; H01L 27/3234; H01L 27/326; H01L 27/3211; H01L 27/323;
(Continued)

(56) References Cited

U.S. PATENT DOCUMENTS

| 11,114,511 B2 * | 9/2021 | Choi .................... G06F 3/04164 |
| 11,429,154 B2 * | 8/2022 | Kwak .................. H04N 5/2258 |

(Continued)

FOREIGN PATENT DOCUMENTS

| CN | 109817109 A | * 5/2019 |
| JP | 2019-215415 | 12/2019 |

(Continued)

OTHER PUBLICATIONS

International Search Report and Written Opinion dated Jul. 5, 2021 in corresponding International Application No. PCT/KR2021/003904.

*Primary Examiner* — Ida M Soward
(74) *Attorney, Agent, or Firm* — Nixon & Vanderhye, P.C.

(57) ABSTRACT

Various embodiments of the disclosure relate to an electronic device including a display and a camera. The electronic device may include a camera overlapping the display and configured to photograph external light passing through the display, wherein the display may include: a colorless and transparent substrate, a pixel layer disposed in a first direction from the substrate and comprising organic light-emitting diode (OLED) type pixels, an organic encapsulation layer (e.g., thin film encapsulation (TFE)) disposed in the first direction from the pixel layer, and a color filter layer disposed in the first direction from the organic encapsulation layer, wherein the display may include: a first area overlapping at least a portion of the camera and a second area not overlapping the camera, wherein an arrangement density of a first group of pixels in the first area may be lower than an arrangement density of a second group of pixels in the second area, and wherein the color filter layer may include first color filters overlapping the pixels of the first group, second color filters overlapping the pixels of the second group, a black matrix disposed between the second color (Continued)

filters in the second area, and a transmission area disposed between the first color filters in the first area.

20 Claims, 20 Drawing Sheets

(51) Int. Cl.
*H01L 27/32* (2006.01)
*H01L 27/14* (2006.01)
*G02F 1/13* (2006.01)
*G06F 1/16* (2006.01)
*G02F 1/1335* (2006.01)
*G02F 1/1362* (2006.01)
*H01L 27/146* (2006.01)
*G02F 1/1333* (2006.01)

(52) U.S. Cl.
CPC .. *G02F 1/133331* (2021.01); *G02F 1/133512* (2013.01); *G02F 1/133528* (2013.01); *G02F 1/136209* (2013.01); *G06F 1/1652* (2013.01); *H01L 27/14678* (2013.01); *H01L 27/323* (2013.01); *H01L 27/3211* (2013.01); *H01L 27/3246* (2013.01); *H01L 51/529* (2013.01); *H01L 51/5293* (2013.01); *H01L 2251/301* (2013.01); *H01L 2251/5338* (2013.01)

(58) Field of Classification Search
CPC ........... H01L 27/14678; H01L 27/3246; H01L 27/3295; H01L 51/5253; H01L 51/0097; H01L 51/5246; H01L 51/5284; H01L 51/5293; H01L 51/529; H01L 2251/301; H01L 2251/5338; G02B 5/201; G02F 1/133512; G02F 1/136209; G02F 1/133528; G02F 1/133331; G06F 1/1652; G06F 1/1616; G06F 1/1626; H04M 1/0214; H04M 1/0264; H04M 1/0268; H04N 5/2257

See application file for complete search history.

(56) References Cited

U.S. PATENT DOCUMENTS

| | | |
|---|---|---|
| 2017/0287992 A1 | 10/2017 | Kwak et al. |
| 2018/0165533 A1 | 6/2018 | Cho et al. |
| 2019/0214601 A1 | 7/2019 | Park |
| 2019/0260919 A1 | 8/2019 | Kwak et al. |
| 2020/0127070 A1 | 4/2020 | Tang |
| 2020/0357871 A1 | 11/2020 | Chung et al. |
| 2021/0065625 A1* | 3/2021 | Wang .................. G09G 3/2074 |
| 2021/0088842 A1 | 3/2021 | Takimoto et al. |

FOREIGN PATENT DOCUMENTS

| | | |
|---|---|---|
| KR | 10-2017-0111827 | 10/2017 |
| KR | 10-2020-0039866 | 4/2020 |

\* cited by examiner

ELECTRONIC DEVICE INCLUDING DISPLAY AND CAMERA

CROSS-REFERENCE TO RELATED APPLICATION

This application is based on and claims priority under 35 U.S.C. § 119 to Korean Patent Application No. 10-2020-0056215, filed on May 11, 2020, in the Korean Intellectual Property Office, the disclosure of which is incorporated by reference herein in its entirety.

BACKGROUND

Field

The disclosure relates to an electronic device including a display and a camera.

Description of Related Art

Electronic devices, for example, portable electronic devices, are released in various sizes according to their functions and user preferences, and may include a large-screen touch display for securing wide visibility and convenient manipulation. The electronic device may include at least one camera. For example, the electronic device may include at least one camera disposed at the periphery of the display or disposed to overlap at least a portion of the display.

Recently, as a method of expanding the display area of a display in an electronic device, a technology for disposing a camera around (e.g., under) an active area of the display has been researched and developed. For example, the electronic device having a camera disposed under the active area of the display is required to improve transmittance in at least a portion of the display overlapping the camera (hereinafter, referred to as "camera overlap area") in order to increase the amount of light incident on the camera. To this end, a method may be proposed to lower the arrangement density of pixels and/or wires of the display in the camera overlap area and form a transmission area in which pixels and/or wires are not formed in the camera overlap area.

In addition, in the electronic device, at least some of the light incident on the camera may be influenced by at least some of the layers of the display, so that defects may occur in the image captured by the camera due to the influence. For example, the defects may include a yellowish phenomenon in which an image is photographed yellow, a rainbow phenomenon in which a photographed image includes a spotted pattern, a color shift phenomenon in which the photographed image displays an unintended color, and the like.

The above information is presented as background information only to assist with an understanding of the disclosure. No determination has been made, and no assertion is made, as to whether any of the above might be applicable as prior art with regard to the disclosure.

SUMMARY

Embodiments of the disclosure may provide an electronic device including a display and a camera.

Embodiments of the disclosure may provide an electronic device including a display and a camera, which is capable of improving transmittance in a camera overlap area of the display overlapping the camera and preventing and/or reducing defects in images photographed through the camera.

An electronic device according to various example embodiments of the disclosure may include: a housing; a display viewable through a portion of the housing; and a camera disposed to overlap the display and configured to photograph external light passing through the display, wherein the display may include a colorless and transparent substrate, a pixel layer disposed in a first direction from the substrate and comprising organic light-emitting diode (OLED) type pixels, an organic encapsulation layer (e.g., a thin film encapsulation (TFE)) disposed in the first direction from the pixel layer, and a color filter layer disposed in the first direction from the organic encapsulation layer, wherein the display may include a first area overlapping at least a portion of the camera and a second area not overlapping the camera, wherein an arrangement density of a first group of pixels in the first area may be lower than an arrangement density of a second group of pixels in the second area, and wherein the color filter layer may include first color filters overlapping the pixels of the first group, second color filters overlapping the pixels of the second group, a black matrix disposed between the second color filters in the second area, and a transmission area disposed between the first color filters in the first area.

A display according to various example embodiments of the disclosure may include: a colorless and transparent substrate; a pixel layer disposed in a first direction from the substrate and comprising organic light-emitting diode type pixels; an organic encapsulation layer (e.g., a thin film encapsulation (TFE)) disposed in the first direction from the pixel layer; a color filter layer disposed in the first direction from the organic encapsulation layer; a first area overlapping at least a portion of the camera; and a second area not overlapping the camera, wherein an arrangement density of a first group of pixels in the first area may be lower than an arrangement density of a second group of pixels in the second area, and wherein the color filter layer may include first color filters overlapping the pixels of the first group, second color filters overlapping the pixels of the second group, a black matrix disposed between the second color filters in the second area, and a transmission area disposed between the first color filters in the first area.

Embodiments of the disclosure are able to provide an electronic device including a display and a camera.

Embodiments of the disclosure are able to improve transmittance in a camera overlap area of a display overlapping a camera and prevent and/or reduce defects in the images photographed through the camera by modifying the structure of the display.

Advantageous effects obtainable from the disclosure may not be limited to the above mentioned effects, and other effects which are not mentioned may be clearly understood, through the following descriptions, by those skilled in the art to which the disclosure pertains.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
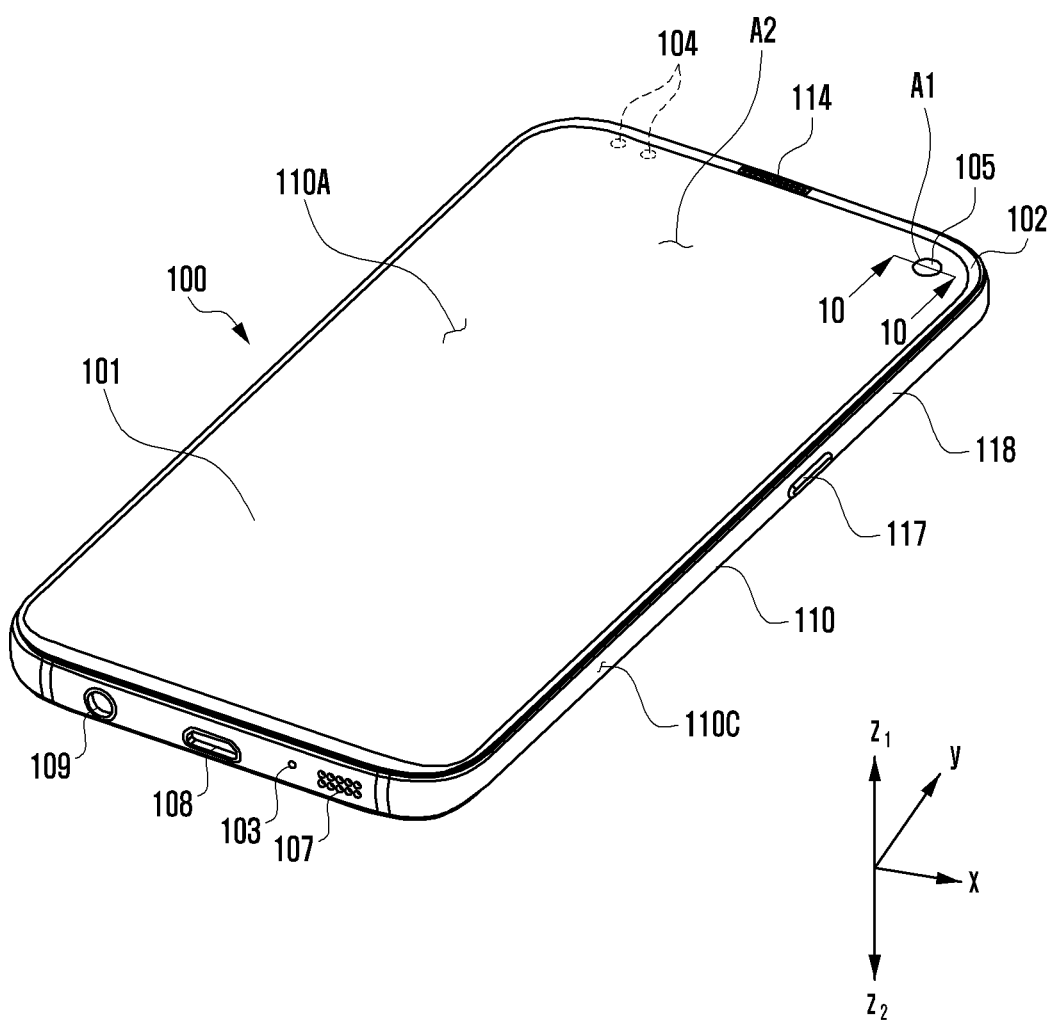
FIG. 1 is a front perspective view illustrating an example electronic device according to various embodiments.
Figure 2:
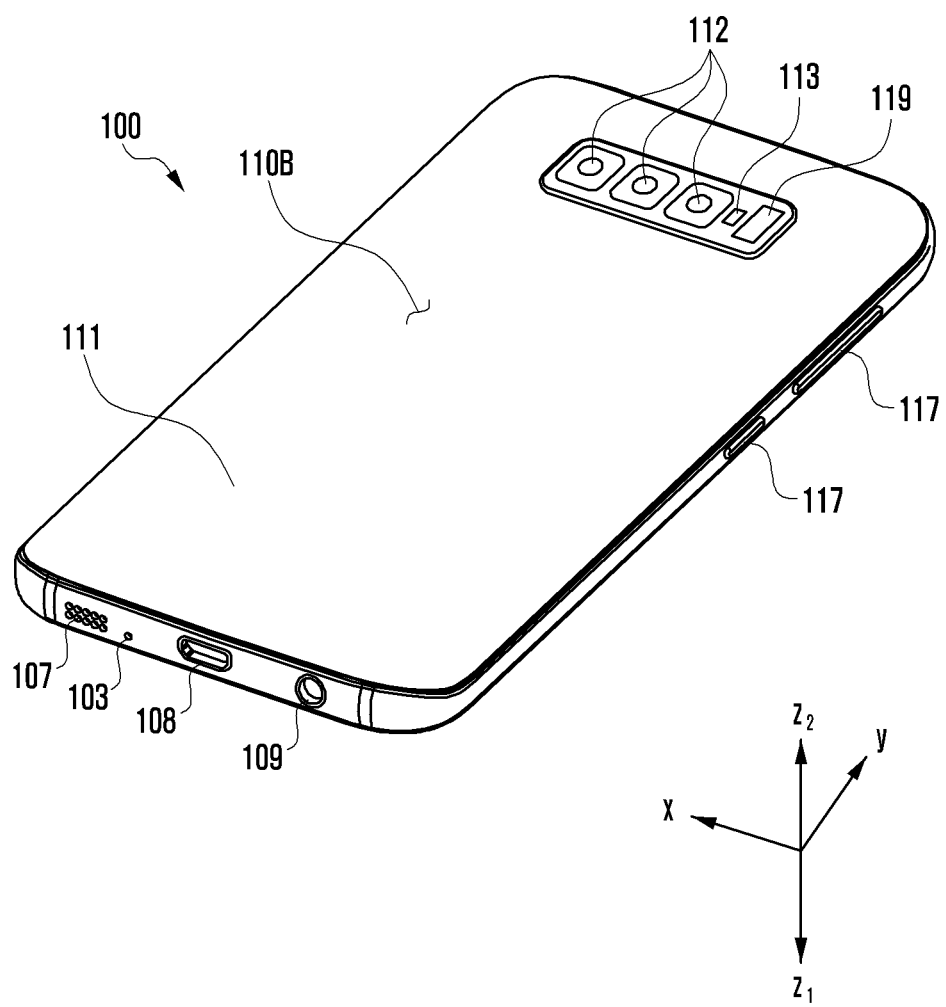
FIG. 2 is a rear perspective view illustrating the electronic device in FIG. 1 according to various embodiments.

FIG. 1 is a front perspective view illustrating an example electronic device 100 according to various embodiments. FIG. 2 is a rear perspective view of the electronic device 100 in FIG. 1 according to various embodiments.

Referring to FIGS. 1 and 2, an electronic device 100 according to an embodiment may include a housing 110 including a first surface (or front surface) 110A, a second surface (a back surface) 110B, and a side surface 110C surrounding the space between the first surface 110A and the second surface 110B. In an embodiment (not shown), the housing may refer to a structure forming a portion of the first surface 110A, the second surface 110B, and the side surface 110C in FIG. 1. According to an embodiment, the first surface 110A may be formed by a front plate 102 (e.g., a glass plate or polymer plate including various coated layers) of which at least a portion is substantially transparent. The second surface 110B may be formed by a rear plate 111 that is substantially opaque.

According to an embodiment, the electronic device 100 may include at least one of a display 101, an input device 103, audio output devices 107 and 114, sensor modules 104 and 119, cameras 105 and 112, a key input device 117, an indicator (not shown), and connectors 108 and 109. In some embodiments, the electronic device 100 may exclude at least one of the elements (e.g., the key input device 117, the connectors 108 and 109, or the indicator), or may further include other elements.

According to an embodiment, the display 101, for example, may be visible through a portion of the front plate 102. In some embodiments, at least a portion of the display 101 may be visible through the front plate 102 configuring the first surface 110A. In some embodiments, the edge of the display 101 may be formed to be substantially the same as the shape of an adjacent outer border of the front plate 102. In an embodiment (not shown), in order to expand the area through which the display 101 is visible, the distance between the outer border of the display 101 and the outer border of the front plate 102 may be formed to be substantially the same.

According to an embodiment, the surface of the housing 110 (or the front plate 102) may include a screen display area that is formed as the display 101 is visually exposed. According to an embodiment, the screen display area may include a camera overlap area A1 (e.g., a first area) in which a first camera 105 is disposed thereunder (e.g., in the direction z2) and a normal display area A2 (e.g., a second area) in which a camera is not disposed thereunder (e.g., in the direction z2). According to an embodiment, the screen display area may further include a sensor overlap area (not shown) in which at least one sensor module (not shown) is disposed thereunder (e.g., in the direction z2). For example, at least one sensor module may be any of various types of sensors which operate by obtaining external light.

According to an embodiment, the cameras 105 and 112 may include a first camera 105 disposed on the first surface 110A of the electronic device 100 and/or a second camera 112 disposed on the second surface 110B thereof. The cameras 105 and 112 may include one or more lenses, an image sensor, and/or an image signal processor. The cameras 105 and 112 may further include a flash 113. In some embodiments, two or more lenses (a wide-angle lens, an ultra-wide-angle lens, or a telephoto lens) and image sensors may be disposed on the first surface 110A or the second surface 110B of the electronic device 100. In an embodiment, the electronic device 100 may include a plurality of cameras 105 and 112. For example, the electronic device 100 may include a plurality of cameras (e.g., a dual camera or a triple camera), which have different properties (e.g., an angle of view) or functions from each other. For example, a plurality of cameras 105 and 112 including lenses having different angles of view from each other may be configured, and the electronic device 100 may perform control to change the angles of view of the cameras 105 and 112 operated in the electronic device 100, based on the user's selection. In addition, the plurality of cameras 105 and 112 may include at least one of a wide-angle camera, a telephoto camera, a color camera, a monochrome camera, or an infrared (IR) camera (e.g., a time-of-flight (TOF) camera or a structured light camera). According to an embodiment, the IR camera may be operated as at least a portion of the sensor module.

According to an embodiment, a first camera 105 may be disposed under the camera overlap area A1 of the display (e.g., in the direction z2). For example, since the first camera 105 is disposed under the camera overlap area A1 of the display (e.g., in the direction z2), the position of the first camera 105 may not be visually distinguished (or exposed). According to an embodiment, when the display 101 is viewed from the front (e.g., in the direction z1), the first camera 105 may obtain an image of an external subject while not being visually exposed to the outside because it is disposed in the camera overlap area A1, which is at least a portion of the display. For example, when the display 101 is viewed from the front (e.g., in the direction z1), the first camera 105 may be disposed to overlap at least a portion of the camera overlap area A, and may not be visually exposed, thereby obtaining an image of an external subject.

According to an embodiment, recesses or openings may be formed in a portion of the screen display area of the display 101 (e.g., the first surface 110A), and at least one of the audio output device 114, the sensor module 104, a light-emitting element (e.g., a flash), and the camera 105 may be provided so as to be aligned, at least in part, with the recesses or the openings. In an embodiment, at least one of the audio output device 114, the sensor module 119, the light-emitting element (e.g., a flash), and the camera 112 may be provided under the screen display area of the display 101.

According to an embodiment, the display 101 may be combined with a touch detection circuit, a pressure sensor capable of measuring the strength (pressure) of a touch, and/or a digitizer for detecting magnetic stylus pens, or may be disposed adjacent thereto.

According to an embodiment, the input device 103 may include a microphone 103. In some embodiments, the input device 103 may include a plurality of microphones 103 arranged to detect the direction of sound. The audio output devices 107 and 114 may include speakers 107 and 114. The speakers 107 and 114 may include an external speaker 107 and a call receiver 114. In some embodiments, the microphone 103, the speakers 107 and 114, and the connectors 108 and 109 may be disposed in the space of the electronic device 100, and may be exposed to the outside through at least one hole formed in the housing 110. In some embodiments, the hole formed in the housing 110 may be used in common for the microphone 103 and the speakers 107 and 114. In some embodiments, the audio output devices 107 and 114 may include a speaker (e.g., a piezo speaker) that operates without the hole formed in the housing 110.

According to an embodiment, the sensor modules 104 and 119 may generate electrical signals or data values corresponding to the internal operation state of the electronic device 100 or the external environment state. The sensor modules 104 and 119, for example, may include a first sensor module 104 (e.g., a proximity sensor) and/or a second sensor module (not shown) (e.g., a fingerprint sensor) disposed in the first surface 110A of the housing 110, and/or a third sensor module 119 (e.g., an IIRM sensor) disposed in the second surface 110B of the housing 110. The fingerprint sensor may be disposed in the first surface 110A of the housing 110, in a portion of the second surface 110B, or under the display 101. The electronic device 100 may further include at least one of sensor modules, which are not shown, for example, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

Figure 3:
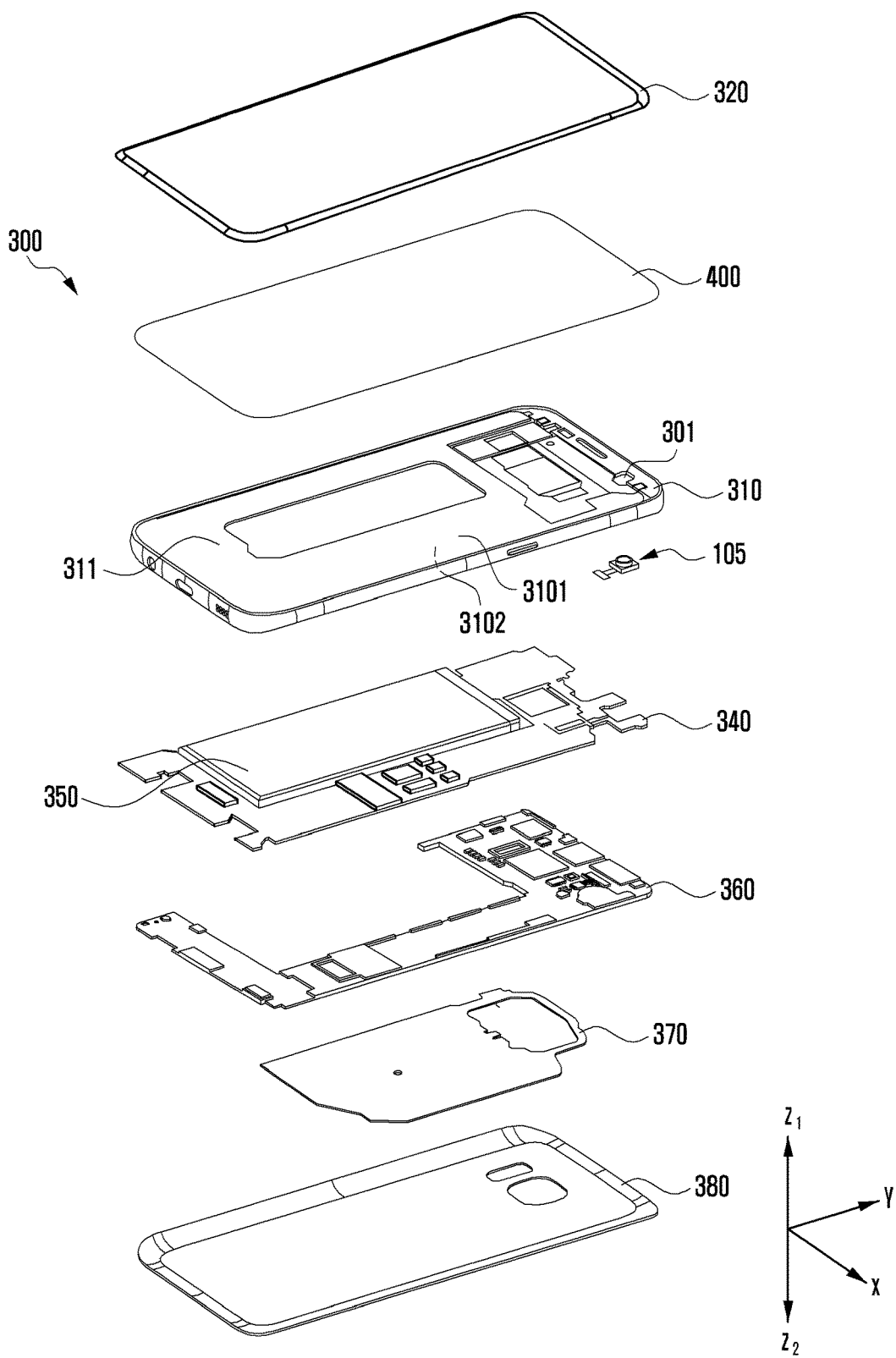
FIG. 3 is an exploded perspective view illustrating the electronic device in FIG. 1 according to various embodiments.

FIG. 3 is an exploded perspective view illustrating the electronic device 100 shown in FIG. 1 according to various embodiments.

The electronic device 300 in FIG. 3 may be similar, at least in part, to the electronic device 100 shown in FIGS. 1 and 2, or may further include other elements.

Referring to FIG. 3, the electronic device 300 (e.g., the electronic device 100 in FIG. 1 or 2) may include a side member 310 (e.g., the side bezel structure 118 in FIG. 2), a first support member 311 (e.g., a bracket or a support structure), a front plate 320 (e.g., a front cover or the front plate 102 in FIG. 1), a display 400 (e.g., the display 101 in FIG. 1), a printed circuit board (PCB) 340 (e.g., a flexible PCB (FPCB) or a rigid flexible PCB (RFPCB)), a battery 350, a second support member 360 (e.g., a rear case), an antenna 370, and a rear plate 380 (e.g., a rear cover or the rear plate 111 in FIG. 2). In some embodiments, the electronic device 300 may exclude at least one of the elements (e.g., the first support member 311 or the second support member 360), or may further include other elements. At least one of the elements of the electronic device 300 may be the same as or similar to at least one of the elements of the electronic device 100 in FIG. 1 or 2, and a redundant description thereof will not be repeated here.

According to an embodiment, the first support member 311 may be disposed inside the electronic device 300, and may be coupled to the side member 310, or may be integrally formed with the side member 310. The first support member 311, for example, may be formed of a metal material and/or a non-metal material (e.g., polymer). The first support member 311 may have one surface to which a display 400 is coupled and the opposite surface to which the printed circuit board 340 is coupled.

According to an embodiment, the printed circuit board 340 may have a processor, a memory, and/or an interface, which are mounted thereto. The processor may include one or more of, for example, a central processing unit, an application processor, a graphic processing unit, an image signal processor, a sensor hub processor, or a communication processor.

According to an embodiment, the memory may include, for example, a volatile memory or a non-volatile memory.

According to an embodiment, the interface may include, for example, a high-definition multimedia interface (HDMI), a universal serial bus (USB) interface, an SD card interface, and/or an audio interface. The interface, for example, may electrically or physically connect the electronic device 300 to an external electronic device, and may include a USB connector, an SD card/MMC connector, or an audio connector.

According to an embodiment, the battery 350 may refer, for example, to a device for supplying power to at least one element of the electronic device 300, and may include, for example, a non-rechargeable primary cell, a rechargeable secondary cell, or a fuel cell. At least a portion of the battery 350, for example, may be disposed substantially on the same plane as the printed circuit board 340. The battery 350 may be integrally disposed inside the electronic device 300. In an embodiment, the battery 350 may be disposed to be detachable from the electronic device 300.

According to an embodiment, the antenna 370 may be disposed between the rear plate 380 and the battery 350. The antenna 370 may include, for example, a near-field communication (NFC) antenna, a wireless charging antenna, and/or a magnetic secure transmission (MST) antenna. The antenna 370, for example, may perform short-range communication with an external device, or may transmit and receive wireless power required for charging. In an embodiment, an antenna structure may be formed by a portion of the side bezel structure 310 and/or the first support member 311, or a combination thereof.

According to an embodiment, the second support member 360 (e.g., the rear case) may be disposed between the printed circuit board 340 and the antenna 370. According to an embodiment, the second support member 360 may include one surface to which at least one of the printed circuit board 340 or the battery 350 is coupled and the opposite surface to which the antenna 370 is coupled.

According to an embodiment, the first support member 311 of the side member 310 may include a first surface 3101 facing the front plate 320 and a second surface 3102 facing in the direction opposite the first surface 3101 (e.g., toward the rear plate 380). According to an embodiment, the camera 105 (e.g., the first camera 105 in FIG. 1) may be disposed between the first support member 311 and the rear plate 380. According to an embodiment, the camera 105 may be disposed to protrude or be visible in the direction toward the front plate 320 through a through-hole 301 leading from the first surface 3101 of the first support member 311 to the second surface 3102 thereof. According to an embodiment, the portion of the camera 105, which protrudes through the through-hole 301, may be disposed at the corresponding position of the display 400 so as to detect an external environment. In an embodiment, if the camera 105 is disposed between the display 400 and the first support member 311, the through-hole 301 may be unnecessary.

Hereinafter, disposition of the display 400 and the camera 105 in the electronic device 300 will be described in greater detail.

An electronic device (e.g., the electronic device 100 in FIG. 1) according to various embodiments of the disclosure may include a housing (e.g., the housing 110 in FIG. 1), a display (e.g., the display 400 in FIG. 4) to be viewed through a portion of the housing 110, and a camera (e.g., the first camera 105 in FIG. 1) disposed to overlap the display 400 and configured to photograph external light passing through the display 400, wherein the display 400 may include a colorless and transparent substrate (e.g., the substrate 511 in FIG. 5), a pixel layer (e.g., the pixel layer 540 in FIG. 5) formed in a first direction (e.g., z1 in FIG. 5) from the substrate 511 and having pixels formed by an organic light-emitting diode (OLED) type, an organic encapsulation layer (e.g., the organic encapsulation layer 550 in FIG. 5) (e.g., a thin film encapsulation (TFE)) formed in the first direction z1 from the pixel layer 540, and a color filter layer (e.g., the color filter layer 433 in FIG. 5) formed in the first direction z1 from the organic encapsulation layer 550, wherein the display 400 may include a first area (e.g., A1 in FIG. 10) overlapping at least a portion of the camera 105 and a second area (e.g., A2 in FIG. 10) that does not overlap the camera 105, wherein the arrangement density of a first group of pixels (e.g., the pixels 901 of the first group in FIG. 10) formed in the first area A1 may be lower than the arrangement density of a second group of pixels (e.g., the pixels 801 of the second group in FIG. 10) formed in the second area A2, and wherein the color filter layer 433 may include first color filters (e.g., the first color filters 902 in FIG. 10) arranged to overlap the pixels 901 of the first group, second color filters (e.g., the second color filters 802 in FIG. 10) arranged to overlap the pixels 801 of the second group, a black matrix (e.g., the black matrix BM in FIG. 11) disposed between the second color filters 802 in the second area A2, and a transmission area (e.g., the transmission area TA in FIG. 10) disposed between the first color filters 902 in the first area A1.

The substrate 511 may, for example, be colorless and transparent glass.

The substrate 511 may, for example be a colorless, transparent, and flexible substrate 511.

The display 400 may not include a polarizer.

An air layer may not be formed between the pixel layer 540 and the organic encapsulation layer 550.

The organic encapsulation layer 550 may include a first inorganic layer 551, an organic layer 552, and a second inorganic layer 553 (refer to FIG. 10), which are formed in the first direction z1.

The substrate 511 and the organic encapsulation layer 550 may be in contact with each other in the area between the pixels 901 (refer to FIG. 9) of the first group.

The surface of the organic encapsulation layer 550 formed in the first area A1 may be even.

The organic layer 552 may have a first variation in height in the first area A1, and the organic layer 552 may have a second variation in height, which is less than the first variation, in the second area A2.

The surface of the organic encapsulation layer 550 may be even from the first area A1 to the second area A2.

In the first area A1, the organic layer 552 may have a first height D1 in the area corresponding to the pixels 901 of the first group, and may have a second height D2 greater than the first height D1 in the area between the pixels 901 of the first group.

The color filter layer 433 may further include third color filters arranged in the transmission area TA, and the area of the third color filters may be less than the area of the first color filters 902 and the area of the second color filters 802.

The color filter layer 433 may further include a second black matrix BM formed to be arranged irregularly between the third color filters in the transmission area TA.

A display (e.g., the display 400 in FIG. 4) according to various example embodiments may include: a colorless and transparent substrate (e.g., the substrate 511 in FIG. 5), a pixel layer (e.g., the pixel layer 540 in FIG. 5) disposed in a first direction (e.g., z1 in FIG. 5) from the substrate and comprising organic light-emitting diode (OLED) type pixels, an organic encapsulation layer (e.g., the organic encapsulation layer 550 in FIG. 5) (e.g., thin film encapsulation (TFE)) disposed in the first direction from the pixel layer, a color filter layer (e.g., the color filter layer 433 in FIG. 5) disposed in the first direction from the organic encapsulation layer, a first area (e.g., the first area A1 in FIG. 10) overlapping at least a portion of a camera (e.g., the camera 105 in FIG. 1), and a second area (e.g., the second area A2 in FIG. 10) not overlapping the camera, wherein the arrangement density of a first group of pixels (e.g., the pixels 901 of the first group in FIG. 10) in the first area may be lower than the arrangement density of a second group of pixels (e.g., the pixels 801 of the second group in FIG. 10) in the second area, and wherein the color filter layer may include first color filters (e.g., the first color filters 902 in FIG. 10) overlapping the pixels of the first group, second color filters (e.g., the second color filters 802 in FIG. 10) overlapping the pixels of the second group, a black matrix (e.g., the black matrix BM in FIG. 11) disposed between the second color filters in the second area, and a transmission area (e.g., the transmission area TA in FIG. 10) disposed between the first color filters in the first area.

The organic encapsulation layer 550 may include a first inorganic layer 551, an organic layer 552, and a second inorganic layer 553, which are formed in the first direction z1.

The substrate 511 and the organic encapsulation layer 550 may be in contact with each other in an area between the pixels overlapping the camera 105.

The surface of the organic encapsulation layer 550 formed in the first area A1 may be even.

The organic layer 552 may have a first variation in height in the first area A1, and the organic layer 552 may have a second variation in height, which is less than the first variation, in the second area A2.

The surface of the organic encapsulation layer 550 may be even from the first area A1 to the second area A2.

In the first area A1, the organic layer 552 may have a first height D1 in an area corresponding to the pixels 901 of the first group, and may have a second height D2 greater than the first height D1 in an area between the pixels 901 of the first group.

A display (e.g., the display 400 in FIG. 4) according to various example embodiments may include: a pixel layer (e.g., the pixel layer 540 in FIG. 5) comprising organic light-emitting diode (OLED) type pixels, an organic encapsulation layer (e.g., the organic encapsulation layer 550 in FIG. 5) (thin film encapsulation (TFE)) disposed in a first direction (e.g., z1 in FIG. 5) from the pixel layer, a color filter layer (e.g., the color filter layer 433 in FIG. 5) disposed in the first direction from the organic encapsulation layer, a first area (e.g., the first area A1 in FIG. 10) overlapping at least a portion of a camera (e.g., the camera 105 in FIG. 1), and a second area (e.g., the second area A2 in FIG. 10) not overlapping the camera, wherein the arrangement density of a first group of pixels (e.g., the pixels 901 of the first group in FIG. 10) in the first area may be lower than the arrangement density of a second group of pixels (e.g., the pixels 801 of the second group in FIG. 10) in the second area, and wherein the color filter layer may include first color filters (e.g., the first color filters 902 in FIG. 10) overlapping the pixels of the first group, second color filters (e.g., the second color filters 802 in FIG. 10) overlapping the pixels of the second group, a black matrix (e.g., the black matrix BM in FIG. 11) disposed between the second color filters in the second area, and a transmission area (e.g., the transmission area TA in FIG. 10) disposed between the first color filters in the first area, wherein the surface of the organic encapsulation layer may be even from the first area to the second area, and wherein the organic encapsulation layer may have a first variation in height in the first area, and the organic encapsulation layer may have a second variation in height, which is less than the first variation in height, in the second area.

Figure 4:
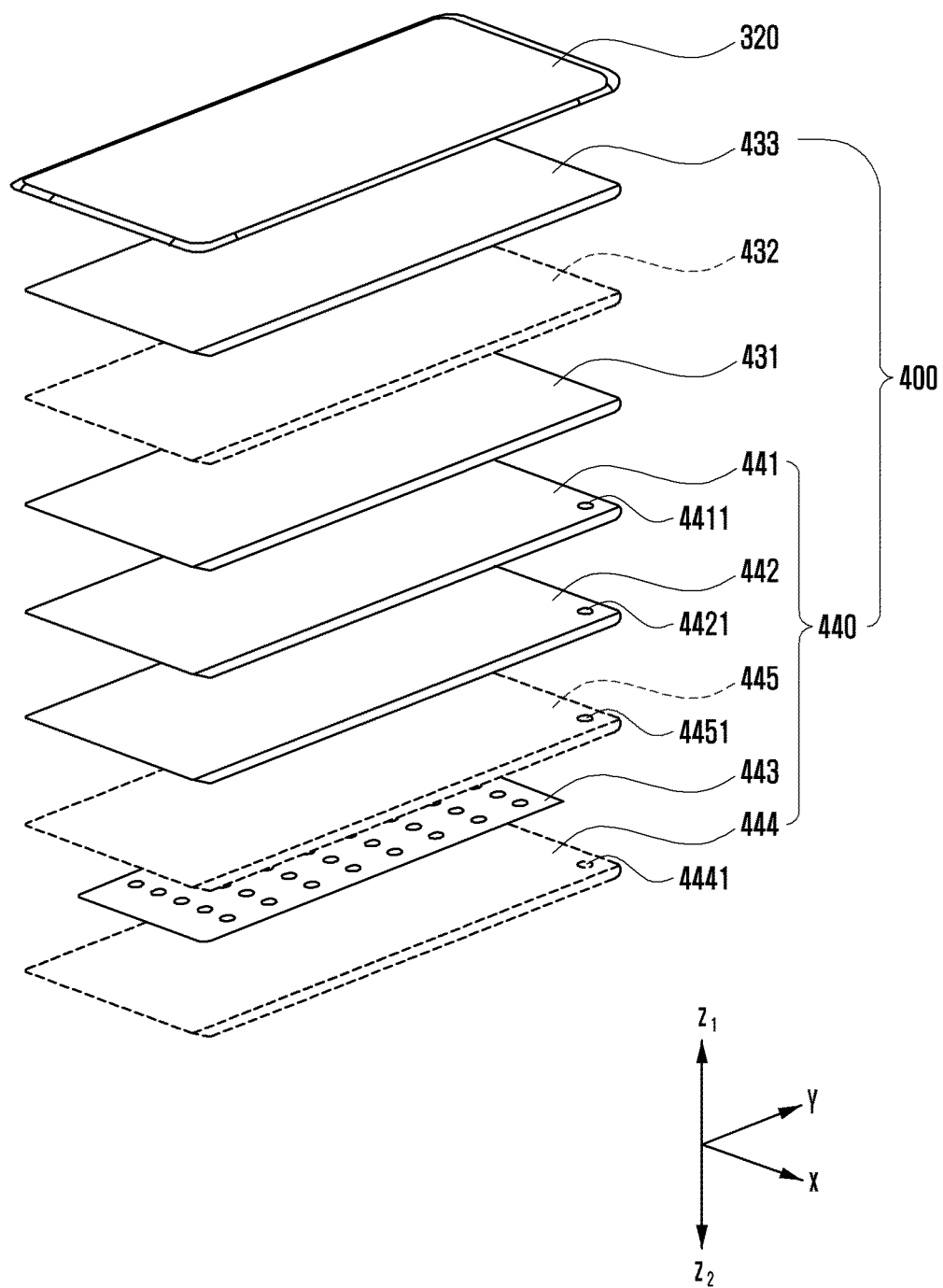
FIG. 4 is an exploded perspective view illustrating an example display according to various embodiments.

FIG. 4 is an exploded perspective view illustrating a display 400 according to various embodiments.

The display 400 in FIG. 4 may be similar, at least in part, to the display 101 in FIG. 1 and the display 400 in FIG. 3, or may further include other elements of a display.

Referring to FIG. 4, the display 400 according to an embodiment may include a display panel 431, a color filter layer 433 formed in a first direction (e.g., the upward direction) from the display panel 431, a touch panel 432 formed between the color filter layer 433 and the display panel 431, and/or a subsidiary material layer 440 formed in a second direction (e.g., the downward direction) from the display panel 431. In an embodiment, the touch panel 432 may be formed in the first direction from the color filter layer 433.

According to an embodiment, the display panel 431 may include organic light-emitting diodes (OLEDs). For example, the display panel 431 may include an unbreakable (UB) type OLED display (e.g., a curved display). According to an embodiment, the display panel 431 may include a first pixel (e.g., the first pixel R1 in FIG. 8) displaying a first color (e.g., red), a second pixel (e.g., the second pixel G1 in FIG. 8) displaying a second color (e.g., green), and/or a third pixel (e.g., the third pixel B1 in FIG. 8) displaying a third color (e.g., blue). According to an embodiment, the first to third pixels may be arranged parallel to each other according to a specified rule. For example, the first to third pixels may be arranged parallel to each other on the x-y plane shown in FIG. 4. According to various embodiments, the display panel 431 is not limited to the pixels of three colors, but may further include the pixels of other colors. For example, the display panel 431 may include pixels of three or more colors. According to various embodiments, the method in which the pixels of the display panel 431 are arranged may be variously modified or changed. According to various embodiments, the areas or shapes of the pixels of the display panel 431 may be variously modified or changed.

According to an embodiment, the display 400 may not include a polarizer (POL), which may be referred to, for example, as a retarder (e.g., a circular retarder), and may include the color filter layer 433 in a color filter-on-encapsulation (COE) type. According to an embodiment, since the display 400 does not include the POL, which is a retarder, it is possible to increase transmittance and to reduce thickness thereof. For example, the display 400 according to an embodiment may improve transmittance by about 20% or more, and may reduce the thickness by about 100 μm to about 150 μm, as compared to a conventional display including the POL, by removing the POL. According to an embodiment, the color filter layer 433 may perform the same or a similar function as the POL applied to the display including an organic light-emitting diodes (OLEDs). For example, the color filter layer 433 may improve outdoor visibility by blocking reflection light by the display panel 431.

According to an embodiment, the subsidiary material layer 440 may include one or more polymer members 441 and 442 disposed on the back surface of the display panel 431 (e.g., the surface directed in the second direction (direction z2)), at least one functional member 443 disposed on the back surface of the one or more polymer members 441 and 442 (e.g., the surface directed in the second direction (direction z2)), and a metal sheet 444 disposed on the back surface of the at least one functional member 443 (e.g., the surface directed in the second direction (direction z2)).

According to an embodiment, the one or more polymer members 441 and 442 may include a light-shielding layer 441 (e.g., a black layer having an uneven pattern) for removing air bubbles, which may be generated between the display panel 431 and the attachments thereunder (e.g., in the second direction (direction z2)) and blocking the light generated from the display panel 431 or the light incident from the outside, and/or a buffer layer 442 (e.g., a sponge layer) disposed to buffer impact. According to an embodiment, the buffer layer 442 may include a cushion made of a polymer.

According to an embodiment, the at least one functional member 443 may include, for example, and without limitation, a heat dissipation sheet for heat dissipation (e.g., a graphite sheet), a force-touch FPCB, a fingerprint sensor FPCB, a communication antenna radiator, a conductive/nonconductive tape, an open cell sponge, or the like.

According to an embodiment, the metal sheet 444, which may include a conductive member (e.g., a metal plate), may contribute to reinforcement of stiffness of the electronic device (e.g., the electronic device 300 in FIG. 3), and may be used to shield ambient noise and dissipate heat emitted from surrounding heat emission components. According to an embodiment, the metal sheet 444 may include at least one of Cu, Al, Mg, SUS (steel use stainless) (e.g., stainless steel (STS)), or CLAD (e.g., a laminated member in which SUS and Al are alternately stacked). In various embodiments, the metal sheet 444 may include other alloy materials.

According to an embodiment, the subsidiary material layer 440 of the display 400 may further include a detection member 445 for detecting input by an electromagnetic induction type writing tool (e.g., an electronic pen). According to an embodiment, the detection member 445, which may include a digitizer, may include a coil member disposed on the dielectric substrate in order to detect resonance frequency by an electromagnetic induction method, which is applied from the electronic pen. In some embodiments, the detection member 445 may be omitted. According to an embodiment, the detection member 445 may be disposed between at least one polymer member 442 and the functional member 443. In an embodiment, the detection member 445 may be disposed between the display panel 431 and at least one polymer member 441. In an embodiment, the detection member 445 may be disposed under the metal sheet 444.

Figure 5:
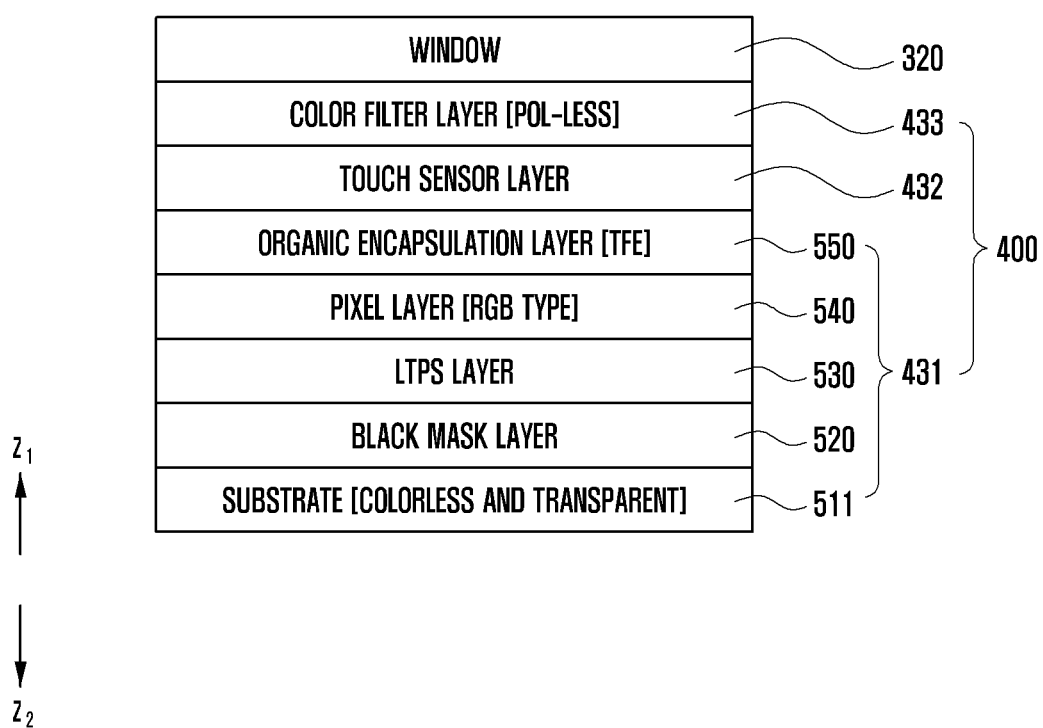
FIG. 5 is a diagram illustrating an example stacked structure of a display according to various embodiments.

According to various embodiments, the subsidiary material layer 440 may include openings 4411, 4421, 4451, and 4441 formed at the positions overlapping the camera (e.g., the camera 105 in FIG. 5). According to an embodiment, the openings 4411, 4421, 4451, and 4441 may be formed by removing portions overlapping the camera 105 from the subsidiary material layer 440. According to an embodiment, the camera 105 may be disposed to be close to the back surface of the display panel 431 (e.g., the surface directed in the second direction (direction z2)) through the openings 4411, 4421, 4451, and 4441. According to an embodiment, the sizes (e.g., diameters or areas) of the plurality of openings 4411, 4421, 4451, and 4441 may be determined based on the size of the camera 105 and/or the angle of view of the camera 500, and the openings 4411, 4421, 4451, and 4441 may have different sizes from each other.

According to an embodiment, the front cover 320 (e.g., a front plate, a glass plate, a first cover member, or a cover member) may be formed in the first direction from the display 400. According to an embodiment, the front cover 320 may include a glass layer. For example, the front cover 320 may include ultra-thin glass (UTG). In some embodiments, the front cover 320 may include a polymer. For example, the front cover 320 may include polyethylene terephthalate (PET) or polyimide (PI). In some embodiments, a plurality of front cover 320 may be disposed. In some embodiments, one layer of the plurality of front covers 320 may be bonded by an adhesive (or bonding agent) that is weaker or thinner than the adhesive of another layer, thereby allowing the one layer to be easily separated from another layer. According to an embodiment, the adhesive may include an optical clear adhesive (OCA), an pressure-sensitive adhesive (PSA), a heat-reactive adhesive, a photo-reactive adhesive, a normal adhesive, and/or a double-sided tape.

According to an embodiment, the display 400 may exclude at least one of the touch panel 432, the detection member 445, and/or the metal sheet 444.

According to an embodiment, the display 400 may include a control module (not shown). According to an embodiment, the control module may include an FPCB for electrically connecting the printed circuit board (e.g., the printed circuit board 340 in FIG. 3) of the electronic device (e.g., the electronic device 300 of FIG. 3) with the display panel 431, and a display driver IC (DDI) mounted on the FPCB. According to an embodiment, the control module (not shown) may include a display driver IC (DDI) and/or a touch display driver IC (TDDI) disposed by a chip-on-panel (COP) or chip-on-film (COF) type.

In an embodiment, the display 400 may include a fingerprint sensor (not shown) disposed around the control module. According to an embodiment, the fingerprint sensor may come into contact with a finger from the outer surface of the front cover 320 through the holes that are at least partially formed in some of the elements of the display 400, or may include an ultrasonic or optical fingerprint sensor capable of recognizing the fingerprint approaching the same.

Figure 6:
FIG. 6 is an image illustrating an example of a yellowish defect.
Figure 7:
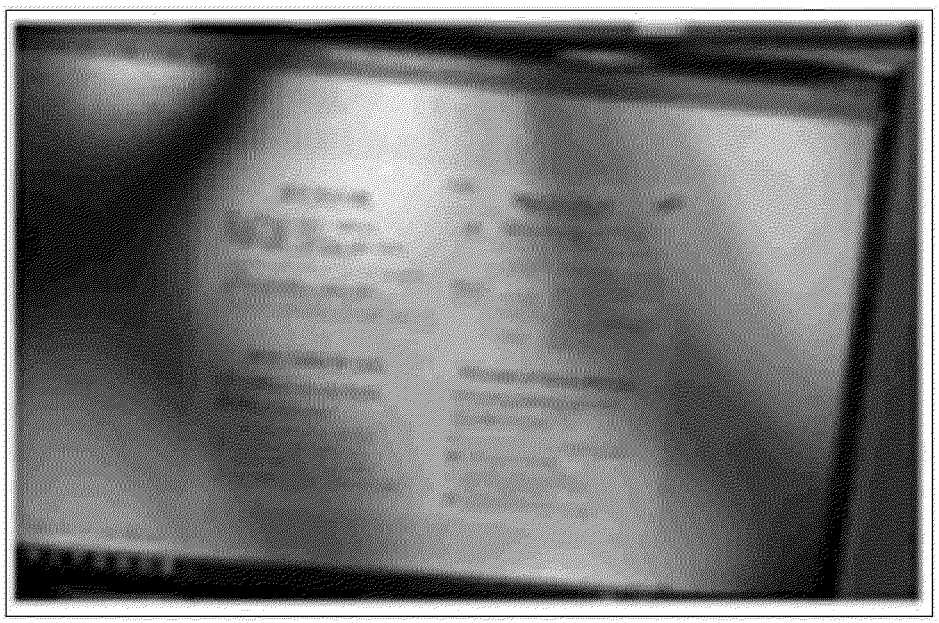
FIG. 7 is an image illustrating an example of a rainbow defect.

FIG. 5 is a diagram illustrating an example stacked structure of a display according to various embodiments. FIG. 6 is an image illustrating an example of a yellowish defect. FIG. 7 is an image illustrating an example of a rainbow defect.

The display 400 illustrated in FIG. 5 may be similar, at least in part, to the display 400 shown in FIG. 4, or may further include other elements. Hereinafter, a redundant description in relation to FIG. 5 may not be repeated here.

Referring to FIG. 5, the display 400 according to an embodiment may include a substrate 511, a black mask layer 520 formed in a first direction z1 (e.g., the upward direction) from the substrate 511, a low-temperature polycrystalline silicon (LTPS) layer 530 formed in the first direction z1 from the black mask layer 520, a pixel layer 540 formed in the first direction z1 from the LTPS layer 530, and/or an organic encapsulation layer 550 formed in the first direction z1 from the pixel layer 540. According to an embodiment, a touch sensor layer 432 may be formed in the first direction z1 from the organic encapsulation layer 550 of the display 400, and a color filter layer 433 may be formed in the first direction z1 from the touch sensor layer 432. According to an embodiment, the touch sensor layer 432 may be formed in the first direction z1 from the color filter layer 433. A window 320 may be disposed as a front cover (e.g., the front cover 320 in FIG. 4) in the first direction z1 of the display 400.

According to an embodiment, the substrate 511 may be formed of a colorless and transparent material. For example, the substrate 511 may be a colorless, transparent, and non-flexible substrate 511. According to an embodiment, the substrate 511 may be colorless and transparent glass.

The display 400 according to an embodiment may prevent and/or reduce a yellowish phenomenon in which the image photographed through the camera 105 becomes yellow as shown in FIG. 6 using the colorless and transparent substrate 511. For example, a display (not shown) according to a comparative example may include a polyimide (PI) film having a yellow color as the flexible substrate, and the yellowish phenomenon in which the image photographed through the camera 105 becomes yellow may occur due to the color of the polyimide (PI) film.

According to an embodiment, the black mask layer 520 may include a black mask (e.g., the black mask metal 521 in FIG. 10) formed in a portion of the first area (e.g., the first area A1 in FIG. 10) overlapping at least a portion of the camera 105 (e.g., the camera 105 in FIG. 1). For example, the black mask 521 may be arranged to overlap one or more pixels 901 formed to overlap the camera in the first area A1. According to an embodiment, the black mask 521 may be provided to reduce unintended diffraction of light in the first area A1, and may form a transmission area (e.g., the transmission area TA in FIG. 10) having a pattern specified by adjusting the shape, size, and/or arrangement density thereof. For example, the transmission area TA may indicate the area through which external light passes. According to an embodiment of the disclosure, since the transmission area TA is formed in a specified pattern, it is possible to reduce the diffraction of the light incident on the camera 105 through the first area A1, thereby improving the quality of the image obtained through the camera 105. According to an embodiment, the black mask 521 may be an opaque metal. According to various embodiments, the black mask 521 may be interchangeably used with terms such as a "light-diffraction prevention film", a "light-transmission prevention film", a "low-reflection light-diffraction prevention film", and a "low-reflection light-transmission prevention film", or may be replaced thereby. According to various embodiments, the black mask 521 may be formed of an organic material or an inorganic material in addition to the opaque metal.

According to an embodiment, for example, the black mask layer 520 may be included in a buffer layer.

According to an embodiment, the LTPS layer 530 may include a thin film transistor (TFT) (not shown) and a plurality of wires for driving the pixel layer 540. For example, the LTPS layer 530 may include a storage capacitor, and the storage capacitor may maintain a voltage signal to the pixel, may maintain a voltage applied to the pixel within one frame, or may reduce a change in the gate voltage of the TFT due to leakage current during the light emission. The storage capacitor may maintain the voltage applied to the pixel at a predetermined time interval by routines (e.g., initialization, data write, etc.) controlling at least one TFT. According to an embodiment, in order to prevent and/or reduce unintended diffraction of light, the TFTs or the wires formed in the first area A1 may be irregularly arranged.

According to an embodiment, the pixel layer 540 may include pixels in an organic light-emitting diode (OLED) type. According to an embodiment, the pixels may include a first pixel (e.g., the first pixel R1 in FIG. 8) displaying a first color (e.g., red), a second pixel (e.g., the second pixel G1 in FIG. 8) displaying a second color (e.g., green), and/or a third pixel (e.g., a third pixel B1 in FIG. 8) displaying a third color (e.g., blue). According to an embodiment, the first to third pixels may be disposed parallel to each other according to a specified rule. According to an embodiment, in order to prevent and/or reduce unintended diffraction of light, the first to third pixels formed in the first area A1 may be irregularly arranged.

According to an embodiment, the pixels may include camera overlap pixels 901 arranged to overlap at least a portion of the camera 105 in the first area A1 (hereinafter, referred to as "a first group of pixels"), and normal pixels 801 formed in the second area A2 (hereinafter, referred to as "a second group of pixels").

According to an embodiment, the organic encapsulation layer 550 may be a thin film encapsulation (TFE) including an organic layer 552. According to an embodiment, the organic encapsulation layer 550 may include at least one inorganic layer and at least one organic layer. According to an embodiment, the organic encapsulation layer 550 may include a first inorganic layer (e.g., the first inorganic layer 551 in FIG. 10) formed in the first direction z1 from the pixel layer 540, an organic layer (e.g., the organic layer 552 in FIG. 10) formed in the first direction z1 from the first inorganic layer 551, and a second inorganic layer (e.g., the second inorganic layer 553) formed in the first direction z1 from the organic layer 552. According to an embodiment, an air layer may not be formed between the organic encapsulation layer 550 and the pixel layer 540. If the air layer is formed between the organic encapsulation layer 550 and the pixel layer 540, the transmittance or the frequency of light incident on the camera 105 through the first area A1 may not be uniform, and an unintended color shift phenomenon may occur in the image photographed by the camera 105. Various embodiments of the disclosure may prevent and/or reduce the color shift phenomenon by excluding the air layer between the organic encapsulation layer 550 and the pixel layer 540.

According to an embodiment, the display 400 (e.g., the display 400 in FIG. 4) may not include a polarizer (POL), which may be a retarder, and may include a color filter layer 433 in a color filter-on-encapsulation (COE) type. According to an embodiment, since the display 400 does not include the POL as a retarder, the transmittance may be increased and the thickness may be reduced. For example, since the transmittance of the POL is 40 to 45%, it is possible to increase the transmittance of the first area A1 only by removing the POL in an embodiment of the disclosure.

The display 400 according to an embodiment may prevent and/or reduce a rainbow phenomenon, in which the image photographed through the camera 105 includes a spotted pattern as shown in FIG. 7, by removing the POL. For example, a combination of the POL and a polymer film (e.g., polyethylene terephthalate (PET)) stacked on at least a portion of the display 400 may cause a phase delay in the light passing through the first area A1, and the phase delay may cause the rainbow phenomenon.

Figure 8:
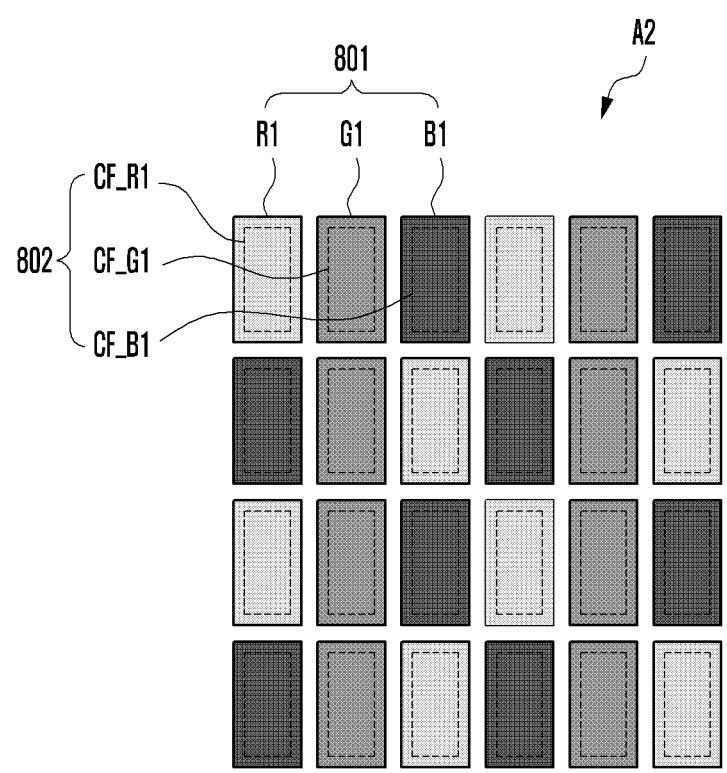
FIG. 8 is a diagram illustrating an example of a normal display area (e.g., a second area) of a display according to various embodiments.

FIG. 8 is a diagram illustrating an example of a normal display area (e.g., a second area A2) of a display 400 according to various embodiments.

The display 400 shown in FIG. 8 may be similar, at least in part, to the display 400 shown in FIG. 4, or may further include other elements.

Referring to FIG. 8, pixels 801 of a second group, which do not overlap the camera 105, may be arranged in the second area A2 of the display 400 according to an embodiment. According to an embodiment, the pixels 801 of the second group may include a first pixel R1 displaying a first color (e.g., red), a second pixel G1 displaying a second color (e.g., green), and/or a third pixel B1 displaying a third color (e.g., blue).

According to an embodiment, the second area A2 of the display 400 may include color filters 802 arranged to at least partially overlap the pixels 801 of the second group. For example, the color filters may include a red color filter CF_R1 arranged to overlap the first pixel R1, a green color filter CF_G1 arranged to overlap the second pixel G1, and a blue color filter CF_B1 arranged to overlap the third pixel B1. According to an embodiment, colors of the color filters may be variously changed. According to an embodiment, the areas or shapes of the color filters may be substantially the same as the areas or shapes of the pixels.

In the following description, the color filters arranged in the second area A2 of the display 400 will be referred to as "second color filters" (e.g., the second color filters 802 in FIG. 10).

Figure 9:
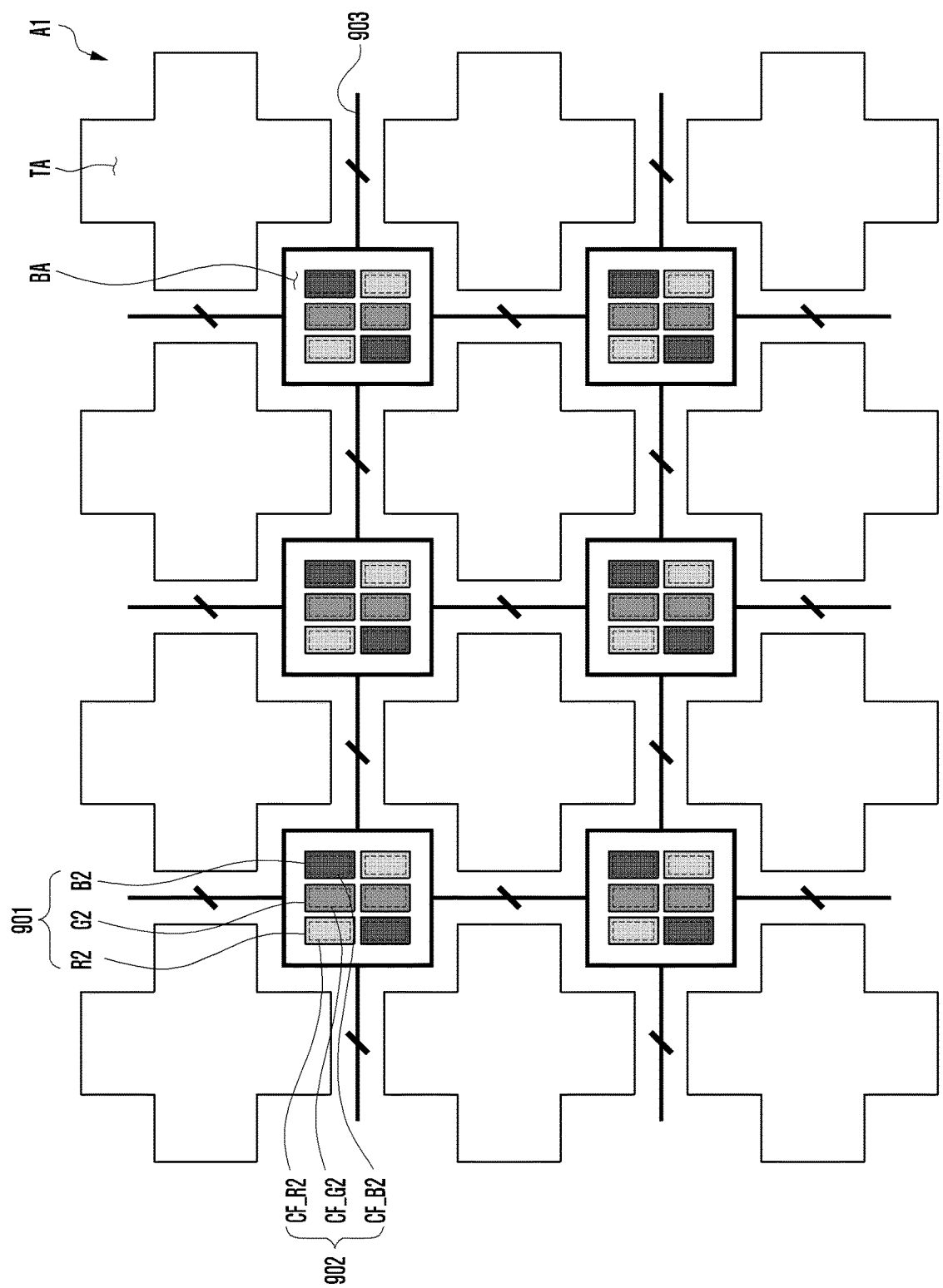
FIG. 9 is a diagram illustrating an example of a camera overlap area (e.g., a first area) of a display according to various embodiments.

FIG. 9 is a diagram illustrating an example of a camera overlap area (e.g., a first area A1) of a display 400 according to various embodiments.

The display 400 shown in FIG. 9 may be similar, at least in part, to the display 400 shown in FIG. 4, or may further include other elements. Hereinafter, a redundant description in relation to FIG. 9 may not be repeated here.

Referring to FIG. 9, pixels 901 of a first group, which overlap at least a portion of the camera 105, may be arranged in the first area A1 of the display 400 according to an embodiment. According to an embodiment, the pixels 901 of the first group may include a first pixel R2 displaying a first color (e.g., red), a second pixel G2 displaying a second color (e.g., green), and/or a third pixel B2 displaying a third color (e.g., blue).

According to an embodiment, the first area A1 of the display 400 may include color filters arranged to overlap the pixels 901 of the first group. For example, the color filters 902 may include a red color filter CF_R2 arranged to overlap the first pixel R2, a green color filter CF_G2 arranged to overlap the second pixel G2, and a blue color filter CF_B2 arranged to overlap the third pixel B2. According to an embodiment, the colors of the color filters may be variously changed.

In the following description, the color filters arranged in the first area A1 of the display 400 will be referred to as "first color filters" (e.g., the first color filters 902 in FIG. 10).

According to an embodiment, the first area A1 of the display 400 may include a black mask 521 arranged to overlap, at least in part, the pixels 901 of the first group, and a blocked area BA and a transmission area TA may be defined by the black mask 521. For example, the blocked area BA may be the area in which the black mask 521 is formed at least in part, and may be the area overlapping the pixels 901 of the first group. For example, the transmission area TA may be the area in which the black mask 521 and the pixels 901 of the first group are not formed. According to an embodiment, the black mask 521 may be provided to reduce unintended diffraction of light in the first area A1, and may form a transmission area TA having a pattern specified by adjusting the shape, size, and/or arrangement density thereof. According to an embodiment of the disclosure, since the transmission area TA is formed in a specified pattern, it is possible to reduce the diffraction of the light incident on the camera 105 through the first area A1, thereby improving the quality of the image obtained through the camera 105. According to an embodiment, the black mask 521 may be an opaque metal. Although the transmission area TA has the shape of a cross in the example shown in FIG. 9, the shape of the transmission area TA may be modified in various ways. According to various embodiments, the layer in which the black mask 521 is formed may be variously modified or changed. For example, the black mask 521 may be formed in the second direction z2 from the substrate 511.

According to an embodiment, a plurality of wires 903 for driving the pixels 901 of the first group may be formed in the blocked area BA. According to an embodiment, the plurality of wires may include touch wires electrically connected to a touch panel.

Comparing FIG. 8 with FIG. 9, in the display 400 according to an embodiment, the arrangement density of the pixels 901 of the first group, which are formed in the first area A1, may be lower than the arrangement density of the pixels 801 of the second group, which are formed in the second area A2. Accordingly, in an embodiment of the disclosure, the transmittance of the first area A1 may be improved. For example, when viewed in the first direction z1 of the display 400, the pixels 901 of the first group, which overlap at least a portion of the camera 105, may be formed to have an arrangement density (e.g., a pixel density) of a first density (e.g., about 50%), and other pixels (e.g., the pixels 801 of the second group) other than the pixels 901 of the first group may be formed to have an arrangement density of a second density (e.g., about 80%), which is different from the first density. For example, the first density may be lower than the second density. According to an embodiment, a plurality of pixels may not be arranged in the area (e.g., the first area A1) that overlaps, at least in part, at least one electronic component (e.g., the camera module or the sensor module) included in the electronic device 100.

Figure 10:
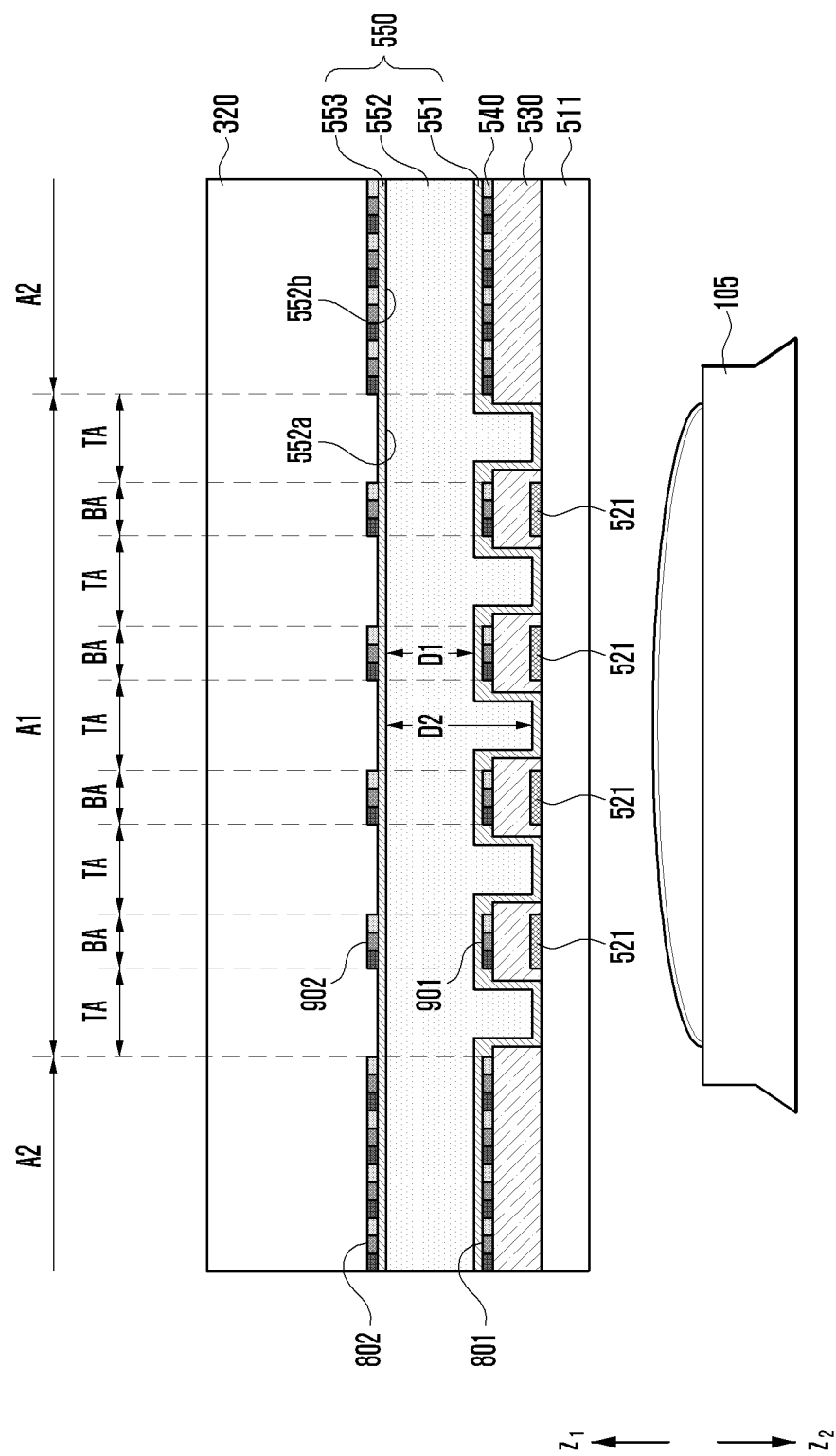
FIG. 10 is a cross-sectional view illustrating a camera overlap area (e.g., a first area) of a display according to various embodiments.

FIG. 10 is a cross-sectional view illustrating an area overlapping a camera 105 (e.g., a first area A1) of a display 400 according to various embodiments. For example, FIG. 10 may be a partially cross-sectional view of the electronic device 100 viewed from the line 10-10 in FIG. 1.

The display 400 shown in FIG. 10 may be similar, at least in part, to the display 400 shown in FIG. 4, or may further include other elements. Hereinafter, a redundant description in relation to FIG. 10 may not be repeated here.

Referring to FIG. 10, the display 400 according to an embodiment may include a substrate 511, a black mask 521 formed in a first direction z1 (e.g., the upward direction) from the substrate 511, a low-temperature polycrystalline silicon (LTPS) layer 530 formed in the first direction z1 from the substrate 511 including the black mask 521, a pixel layer 540 formed in the first direction z1 from the LTPS layer 530, and/or an organic encapsulation layer 550 formed in the first direction z1 from the pixel layer 540. According to an embodiment, a color filter layer 433 which is not shown may be formed in the first direction z1 from the organic encapsulation layer 550 of the display 400. According to an embodiment, a touch sensor layer 432, which is not shown, may be further formed between the organic encapsulation layer 550 and the color filter layer 433. According to an embodiment, the touch sensor layer 432 may be formed in the first direction z1 from the color filter layer 433. A window 320 may be disposed as a front cover (e.g., the front cover 320 in FIG. 4) in the first direction z1 of the display 400.

According to an embodiment, an air layer may not be formed between the organic encapsulation layer 550 and the pixel layer 540. If the air layer is formed between the organic encapsulation layer 550 and the pixel layer 540, the transmittance or the frequency of the light incident on the camera 105 through the first area A1 may not be uniform, and an unintended color shift phenomenon may occur in the image photographed by the camera 105. Various embodiments of the disclosure may prevent and/or reduce the color shift phenomenon by excluding the air layer between the organic encapsulation layer 550 and the pixel layer 540.

According to an embodiment, the pixels 901 of the first group may be arranged in the first area A1, and the black mask 521 and the first color filters (e.g., the first color filters 902 in FIG. 9) may be arranged to overlap the pixels 901 of the first group. According to an embodiment, the area overlapping at least in part the pixels 901 of the first group may be referred to as a "blocked area BA".

According to an embodiment, the black mask 521 may not be formed in the area between the pixels 901 of the first group. For example, the area between the pixels 901 of the first group may be referred to as a "transmission area TA".

According to an embodiment, the pixels 801 of the second group may be arranged in the second area A2, and second color filters (e.g., the second color filters 802 in FIG. 8) may be arranged to overlap the pixels 801 of the second group.

According to an embodiment, the organic encapsulation layer 550 may include a first inorganic layer 551 formed in the first direction z1 from the pixel layer 540, an organic layer 552 formed in the first direction z1 from the first inorganic layer 551, and a second inorganic layer 553 formed in the first direction z1 from the organic layer 552.

According to an embodiment, the pixel layer 540 and the LTPS layer 530 may be removed from the transmission area TA. For example, the substrate 511 and the organic encapsulation layer 550 may be in contact with each other in the transmission area TA. For example, the substrate 511 and the first inorganic layer 551 of the organic encapsulation layer 550 may be in contact with each other in the transmission area TA. The embodiment of the disclosure described above may improve the transmittance in the first area A1.

Figure 11:
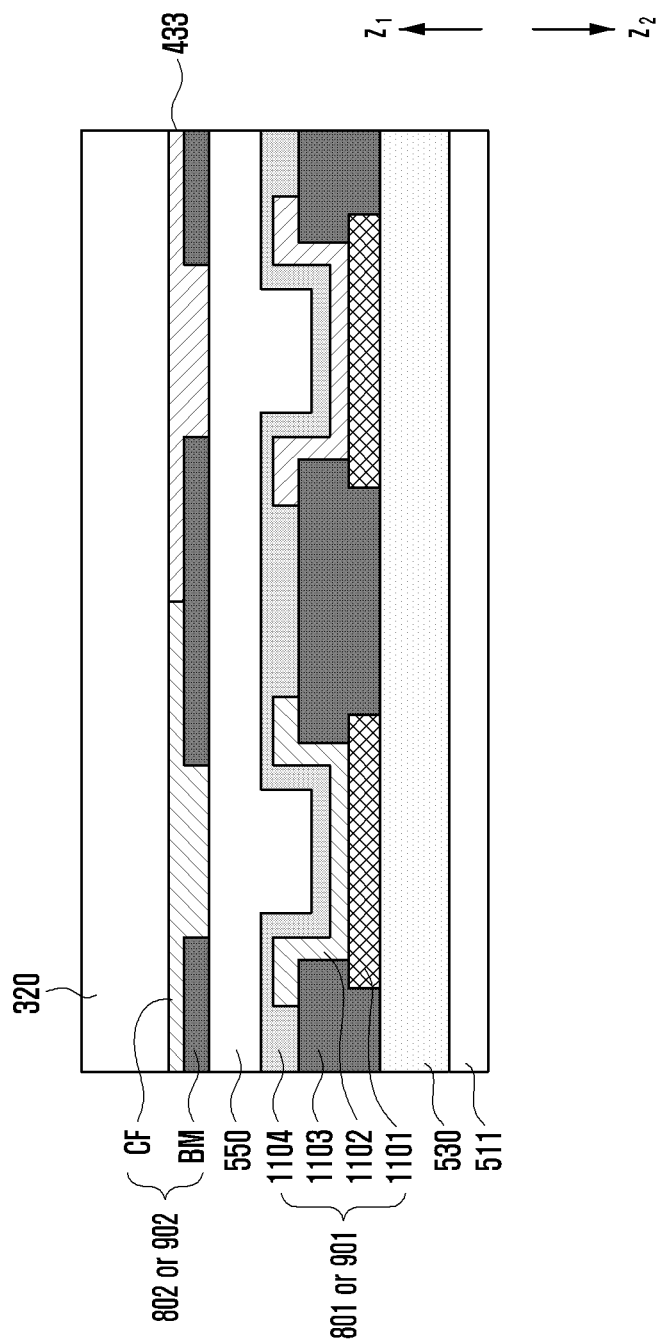
FIG. 11 is a cross-sectional view illustrating a color filter layer according to various embodiments.

FIG. 11 is a cross-sectional view illustrating a color filter layer 433 according to various embodiments.

Referring to FIG. 11, the display 400 according to an embodiment may have pixels 901 of a first group or pixels 801 of a second group formed in a first direction z1 from the LTPS layer 530 and an organic encapsulation layer 550 formed in the first direction z1 from the pixels 901 of the first group or the pixels 801 of the second group.

According to an embodiment, a color filter layer 433 may be formed in the first direction z1 from the organic encapsulation layer 550, and the color filter layer 433 may include color filters CF (e.g., the first color filters 902 or the second color filters 802 in FIG. 10) and a black matrix BM.

According to an embodiment, the color filters CF may be arranged to overlap the pixels 901 of the first group or the pixels 801 of the second group. For example, the color filters CF may include first color filters 902 arranged to overlap the pixels 901 of the first group and second color filters 802 arranged to overlap the pixels 801 of the second group.

According to an embodiment, the black matrix BM may be arranged to overlap the area between the pixels 901 of the first group. The black matrix BM may be arranged to overlap at least a portion of the area between the pixels 801 of the second group.

In the illustrated example, reference numeral 1101 may be a first electrode (e.g., an anode electrode) of the OLED formed in the first direction z1 from the LTPS layer 530.

In the illustrated example, reference numeral 1102 may be an organic light-emitting layer formed in the first direction z1 from the first electrode.

In the illustrated example, reference numeral 1103 may be a bank that partitions the first electrode and the organic light-emitting layer. For example, the bank 1103 (e.g., a partition wall) may be positioned on the LTPS layer 530. The bank 1103 may include organic materials, such as polyacrylate resin, polyimides resin, or the like, or silica-based inorganic materials. According to an embodiment, the bank 1103 may include a light-shielding material, thereby blocking the light. In the case where the bank 1103 includes a light-shielding material, it is possible to prevent and/or reduce the mixture of colors between the light generated in the organic light-emitting layer of one pixel and the light generated in the organic light-emitting layer of a neighboring pixel. In an embodiment, the bank 1103 may include an opaque material, and may play the role of blocking light. In the case where the bank 1103 does not include the POL, it may play the role of blocking the reflection of external light.

In the illustrated example, reference numeral 1104 may be a second electrode (e.g., a cathode electrode) of the OLED. Although not shown, at least a portion of the second electrode 1104 may be removed from the area overlapping the transmission area TA.

Figure 12:
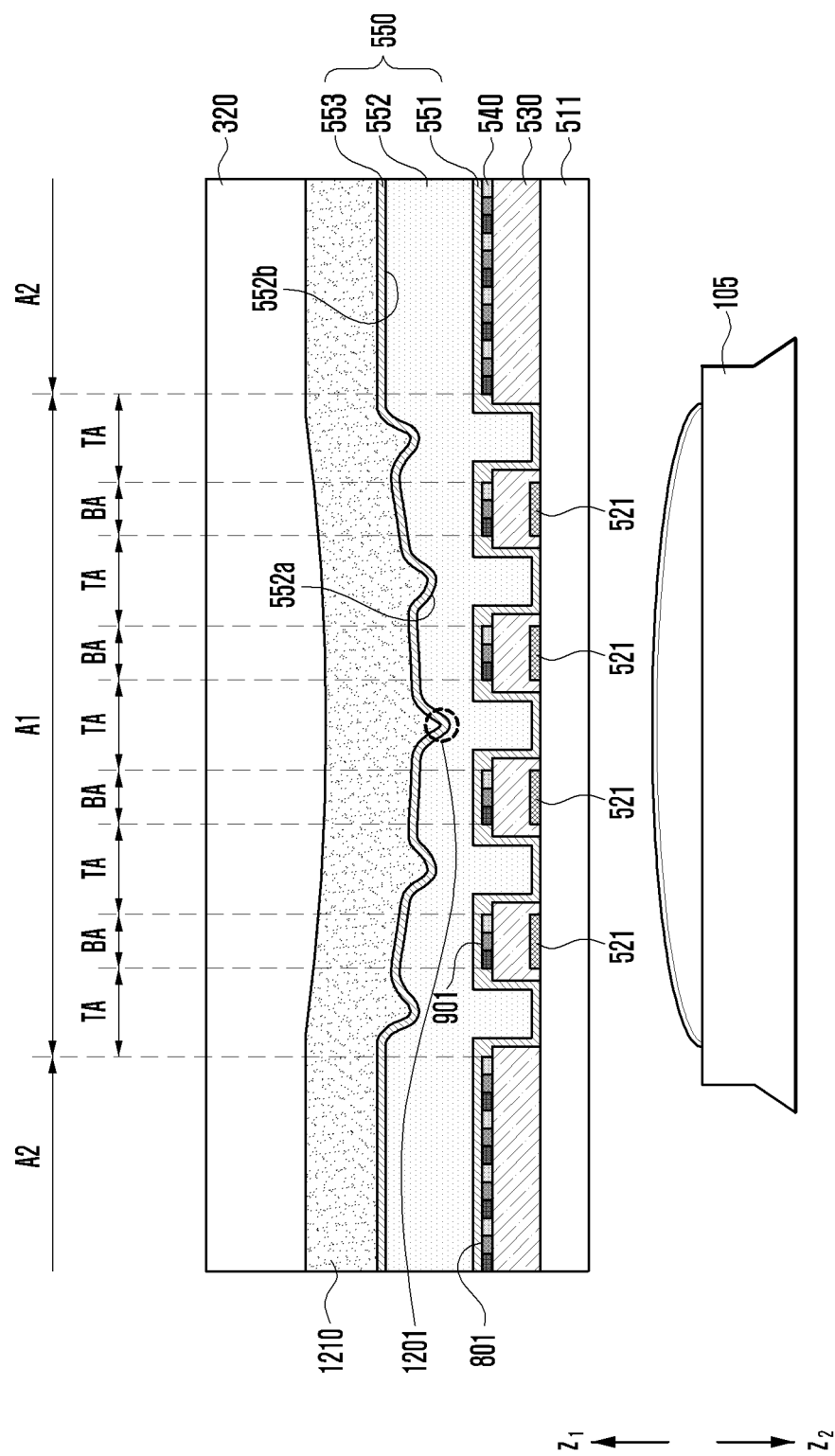
FIG. 12 is a cross-sectional view illustrating a camera overlap area of a display according to a comparative example.

FIG. 12 is a cross-sectional view illustrating an area A1 overlapping a camera 105 of a display 400 according to a comparative example.

Referring to FIG. 10 together, in an embodiment of the disclosure, the pixel layer 540 and the LTPS layer 530 may be removed from the transmission area TA. However, if the organic encapsulation layer 550 is formed by a normal method after the process of removing the pixel layer 540 and the LTPS layer 530 from the transmission area TA, unevenness may occur in the surface of the organic encapsulation layer 550. The comparative example shown in FIG. 12 may be the example in which the organic encapsulation layer 550 is formed by a normal method after the process of removing the pixel layer 540 and the LTPS layer 530 from the transmission area TA.

Referring to FIG. 12, after the process of removing the pixel layer 540 and the LTPS layer 530, high steps may be produced in the transmission area TA. The high steps in the transmission area TA may increase the surface area of the transmission area TA, and may cause unevenness in the surface of the organic layer 552 formed in the transmission area TA. For example, the surface 552a of the organic layer 552 may be uneven in the first area A1 as shown FIG. 12.

According to the comparative example, since the transmission area TA from which the pixel layer 540 and the LTPS layer 530 are removed is formed only in the first area A1, the surface area of the first area A1 may be greater than the surface area of the second area A2, based on substantially the same area. Therefore, if the composition material of the organic layer 552 is uniformly applied to the first area A1 and the second area A2, the height of the surface 552a of the organic layer 552 formed in the first area A1 may be lower than the height of the surface 552a of the organic layer 552 formed in the second area A2. In addition, as indicated by reference numeral 1201 in FIG. 12, a concave deposition phenomenon may occur in which the surface of the organic layer 552 is recessed in a second direction z2 (e.g., the downward direction) at the center of the first area A1. The organic encapsulation layer 550 in which the concave deposition phenomenon occurs may play the role of a concave lens, which may cause defocus defects in which the focal length is unintentionally increased in the camera 105.

In an embodiment of the disclosure, in order to prevent and/or reduce unevenness in the surface of the organic encapsulation layer 550, the composition material of the organic layer 552 may not be uniformly applied to the first area A1 and the second area A2 when forming the organic layer 552 of the organic encapsulation layer 550. For example, in an embodiment of the disclosure, a larger amount of composition material of the organic layer 552 may be applied to a unit area of the first area A1, and a smaller amount of the composition material of the organic layer 552 may be applied to a unit area of the second area A2.

Accordingly, the display 400 according to an embodiment of the disclosure, as shown in FIG. 10, may have the first area A1 in which the surface of the organic encapsulation layer 550 is uniform, and may prevent and/or reduce the defocus defect therein. For example, as shown in FIG. 10, the organic layer 552 formed in the first area A1 may have a first height (e.g., D1 in FIG. 10) in the area overlapping the pixels 901 of the first group, and may have a second height (the second height D2 in FIG. 10), which is greater than the first height (e.g., the first height D1 in FIG. 10), in the area between the pixels 901 of the first group (e.g., the area overlapping the transmission area TA). For example, as shown in FIG. 10, the organic layer 552 may have may have a first variation in height (e.g., the variation corresponding to the height of the pixels 801 of the second group) in the first area A1, and the organic layer may have a second variation in height (e.g., the variation corresponding to the height of the LTPS layer 530 and the height of the pixels 901 of the first group), which is smaller than the first variation, in the second area.

Referring to FIG. 10, in an embodiment of the disclosure, the surface 552a of the organic encapsulation layer 550 formed in the first area A1 may be substantially even. In addition, the height of the surface 552a of the organic encapsulation layer 550 formed in the first area A1 may be the same as the height of the surface 552b of the organic encapsulation layer 550 formed in the second area A2. For example, the surfaces 552a and 552b of the organic encapsulation layer 552 may be even from the first area A1 to the second area A2. As described above, according to an embodiment shown in FIG. 10, although the transmission area TA has the steps, a larger amount of composition material of the organic layer 552 may be applied to a unit area of the first area A1, so that unevenness in the surface of the organic encapsulation layer 550 may not occur. Accordingly, according to an embodiment of the disclosure, the defocus defects, in which the focal length is unintentionally increased, may be prevented and/or reduced in the camera 105.

In the illustrated example, reference numeral 1210 may, for example, be the POL according to the comparative example.

Figure 13:
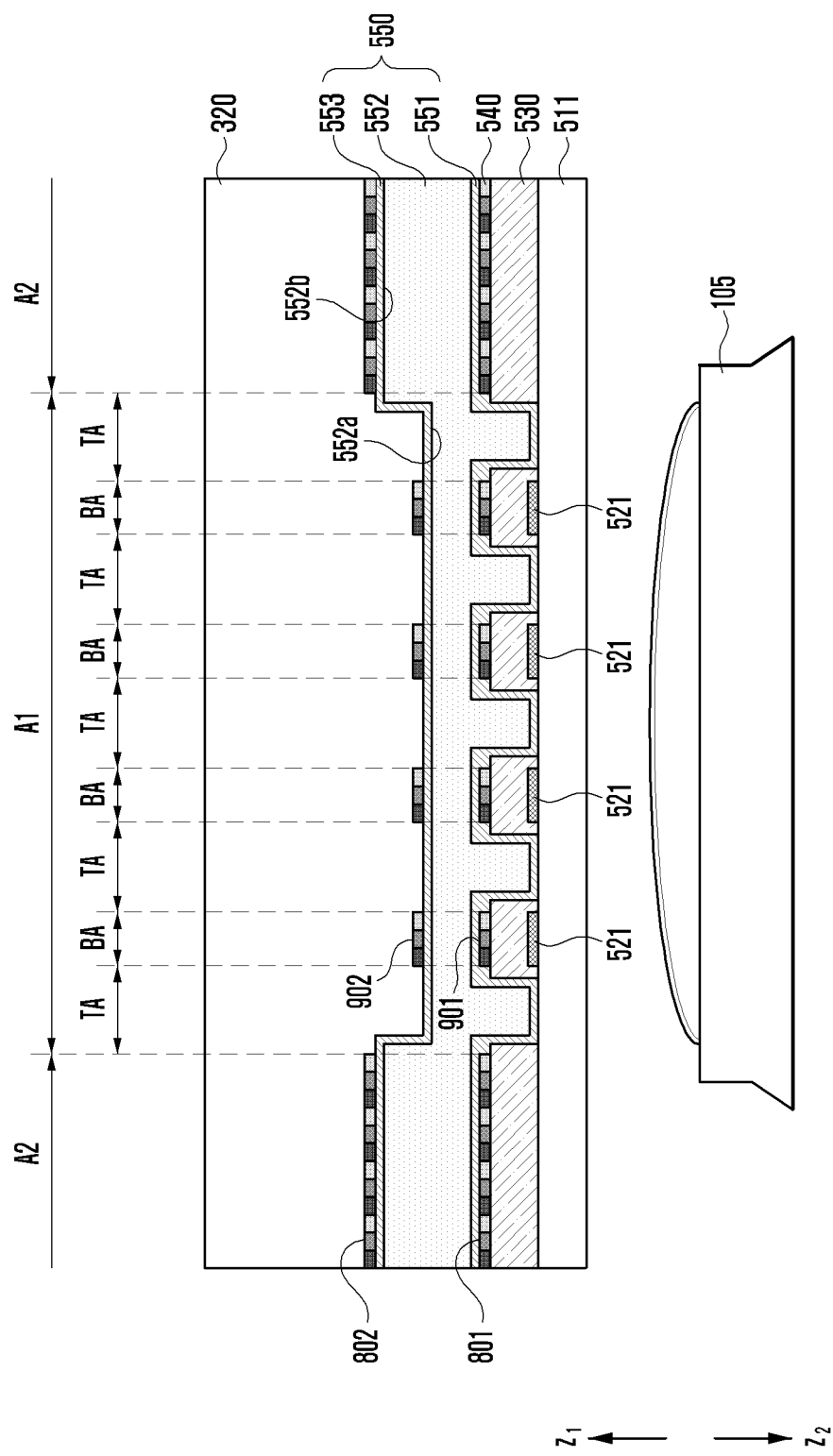
FIG. 13 is a cross-sectional view illustrating an example embodiment in which the structure of an organic encapsulation layer is modified.

FIG. 13 is a cross-sectional view illustrating an embodiment in which the structure of an organic encapsulation layer 550 is modified.

The embodiment shown in FIG. 13 may be similar, at least in part, to the embodiment shown in FIG. 10, or may further include other embodiments. Hereinafter, a redundant description in relation to FIG. 13 may not be repeated here.

Referring to FIG. 13, in an embodiment of the disclosure, the composition material of the organic layer 552 is uniformly applied to the first area A1 and the second area A2, and an etching process is further performed on the first area A1, so that the surface of the organic layer 552 may be uniform in the first area A1. Accordingly, in an embodiment of the disclosure, although the surface height 552a of the organic layer 552 in the first area A1 is less than the surface height 552b of the organic layer 552 in the second area A2, the surface of the organic encapsulation layer 550 may be formed uniformly in the first area A1, thereby preventing and/or reducing the aforementioned defocus defect.

Figure 14:
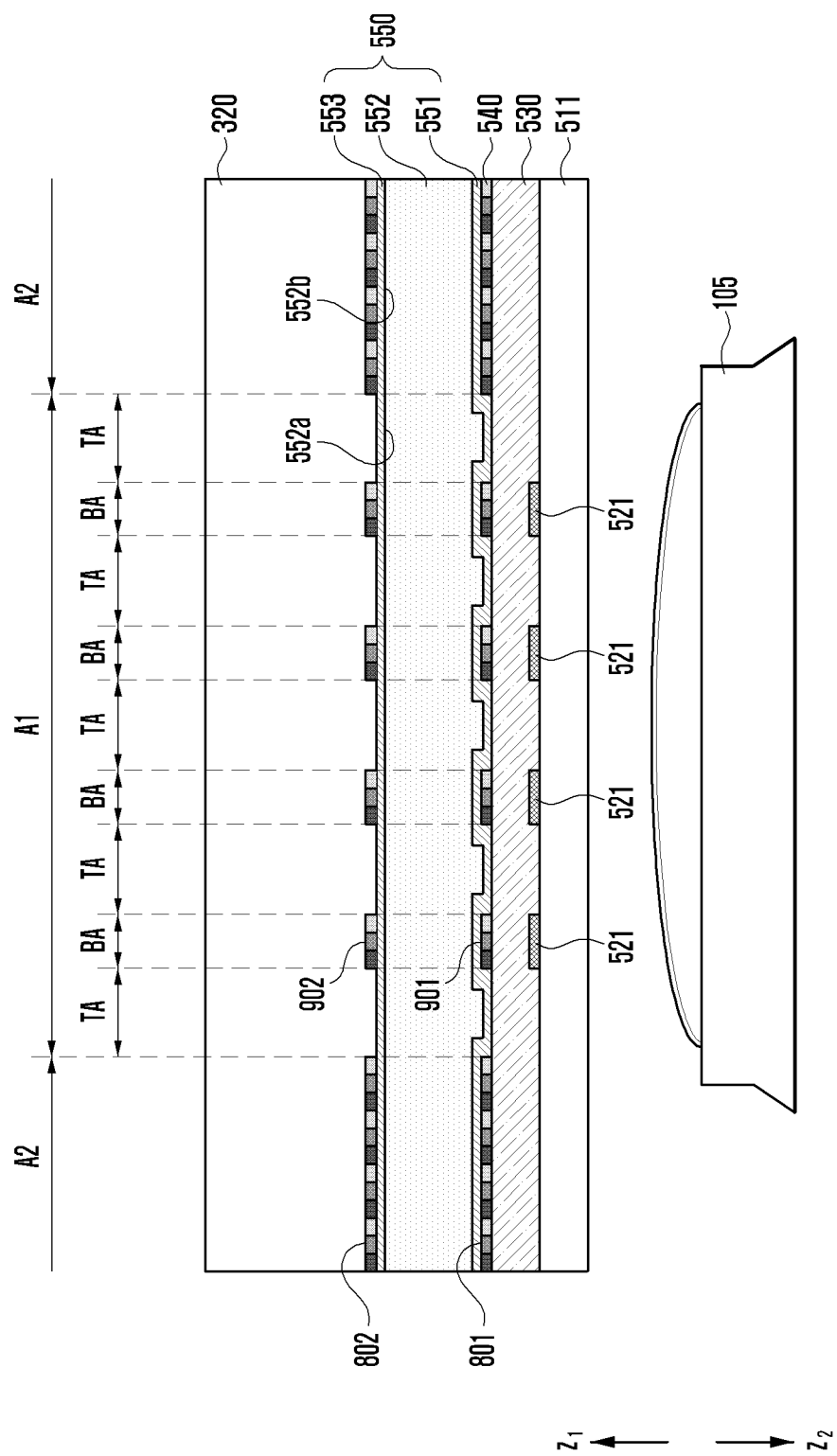
FIG. 14 is a cross-sectional view illustrating an example embodiment in which an LTPS layer is not removed.

FIG. 14 is a cross-sectional view illustrating an embodiment in which an LTPS layer 530 is not removed.

The embodiment shown in FIG. 14 may be similar, at least in part, to the embodiment shown in FIG. 10, or may further include other embodiments. Hereinafter, a redundant description in relation to FIG. 14 may not be repeated here.

Referring to FIG. 14, an embodiment of the disclosure may include an LTPS layer 530 in the transmission area TA of the first area A1. Accordingly, the relatively high step is not produced in the transmission area TA, and even if the composition material of the organic layer 552 is uniformly applied to the first area A1 and the second area A2 in the deposition process of the organic layer 552, unevenness may not occur in the surface of the organic layer 552.

Figure 15:
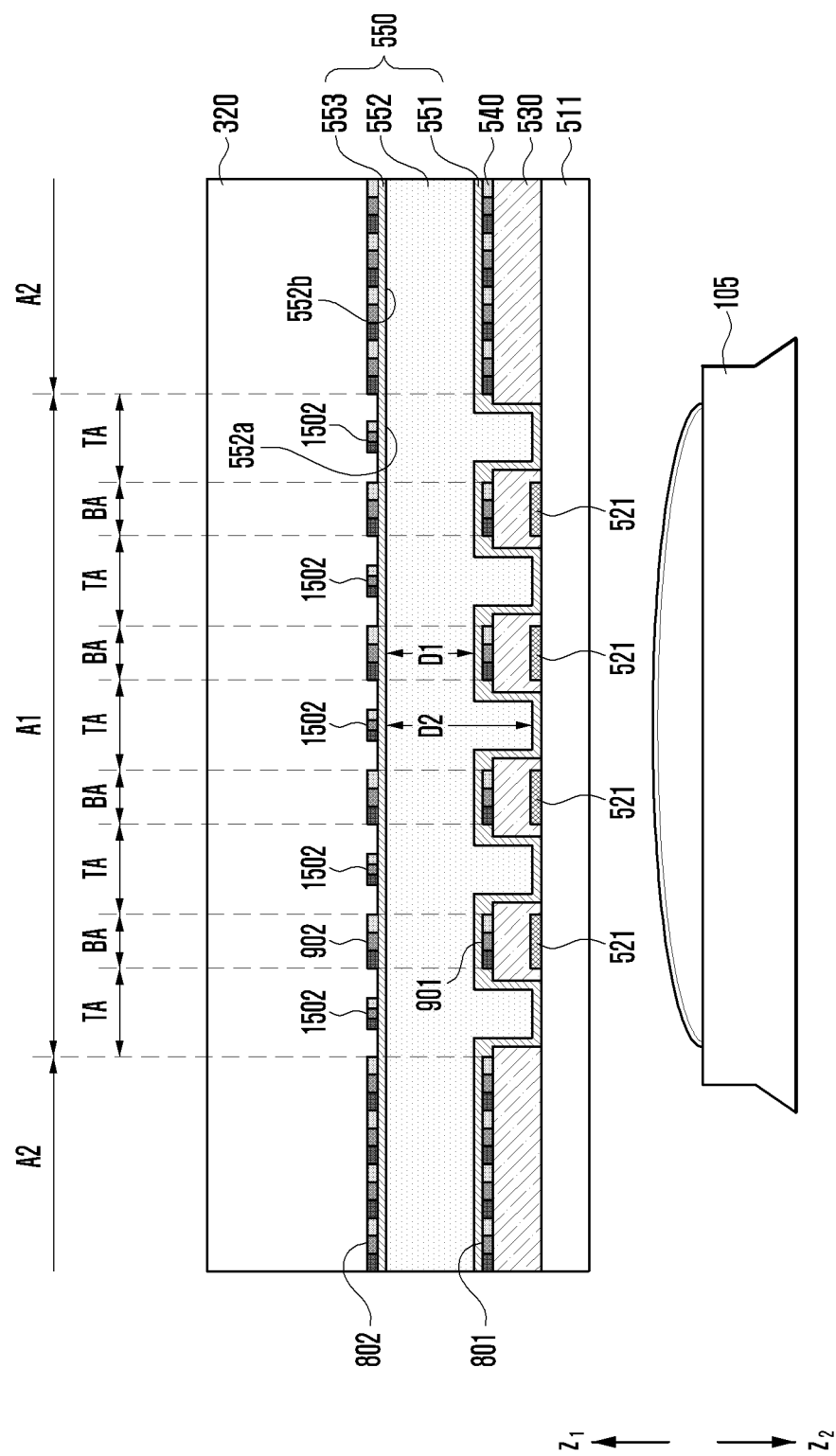
FIG. 15 is a cross-sectional view illustrating an example embodiment in which a color filter is formed in a transmission area.
Figure 16:
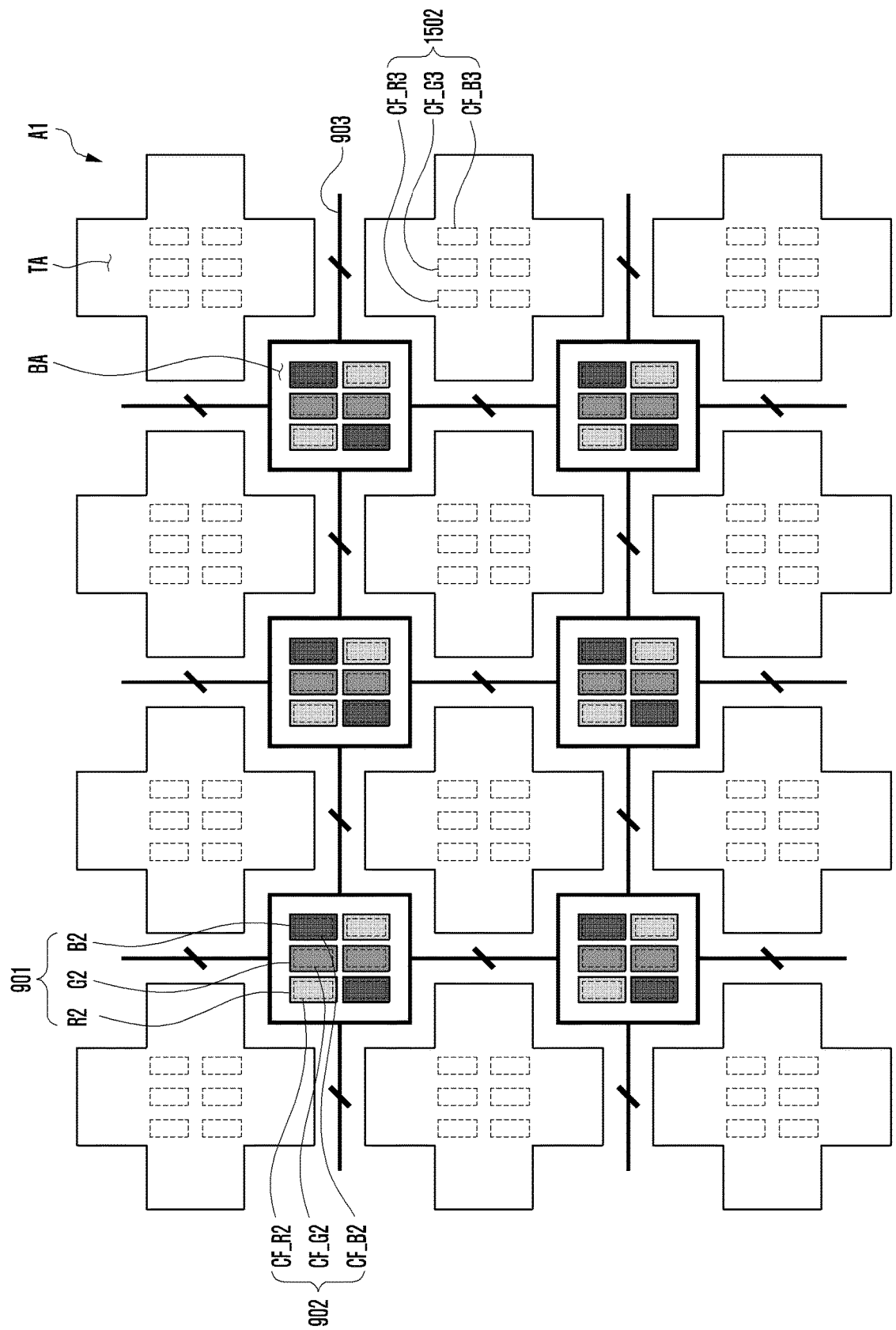
FIG. 16 is a diagram illustrating an example embodiment in which a color filter is formed in a transmission area.

FIG. 15 is a cross-sectional view illustrating an embodiment in which a color filter is formed in a transmission area TA. FIG. 16 is a plan view illustrating an embodiment in which a color filter is formed in a transmission area TA.

The embodiments shown in FIGS. 15 and 16 may be similar, at least in part, to the embodiments shown in FIGS. 9 and 10, or may further include other embodiments. Hereinafter, a redundant description in relation to FIGS. 15 and 16 may not be repeated here.

Referring to FIGS. 15 and 16, an embodiment of the disclosure may further include color filters 1502 formed in the transmission area TA of the first area A1. For example, the color filter layer 433 may further include a third color filters 1502 arranged in the transmission area TA.

According to an embodiment, the third color filters 1502 may include a red color filter CF_R3, a green color filter CF_G3, and a blue color filter CF_B3. In this embodiment, the third color filters 1502 may be dummy color filters, which may prevent and/or reduce user visibility for the first area A1. For example, since the third color filters 1502 are further formed as dummy color filters, the user may not easily distinguish the first area A1 from the second area A2 while the display 400 is turned off or the display 400 is displaying black. According to an embodiment, the configuration of the third color filters 1502 is not limited to the illustrated example, and may be variously modified. For example, the colors (e.g., the red color filter CF_R3, the green color filter CF_G3, and the blue color filter CF_B3) and/or the number of the third color filters 1502 may be variously changed. For example, the third color filters 1502 may be configured as only green color filters.

In an embodiment, the area of the third color filters 1502 may be smaller than the area of the first color filters 902 and/or the area of the second color filters 802.

In an embodiment, the color filter layer 433 may further include a second black matrix (not shown) formed and arranged irregularly between the third color filters 902. For example, since the second black matrix (not shown) is arranged irregularly, it is possible to prevent and/or reduce unintended diffraction of the light incident on the camera 105.

Figure 17:
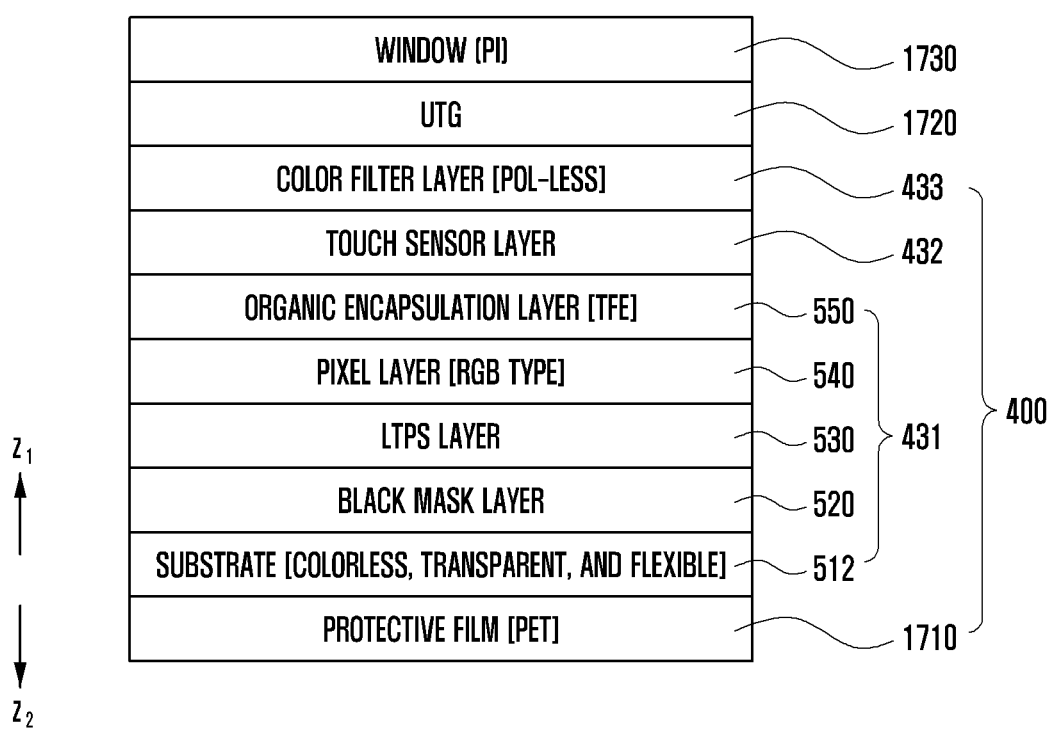
FIG. 17 is a diagram illustrating an example stacked structure of a display including a flexible substrate according to various embodiments.

FIG. 17 is a diagram illustrating an example stacked structure of a display including a flexible substrate according to various embodiments.

The embodiments shown in FIG. 17 may be similar, at least in part, to the embodiments shown in FIG. 5, or may further include other embodiments. Hereinafter, a redundant description in relation to FIG. 17 may not be repeated here.

Figure 18:
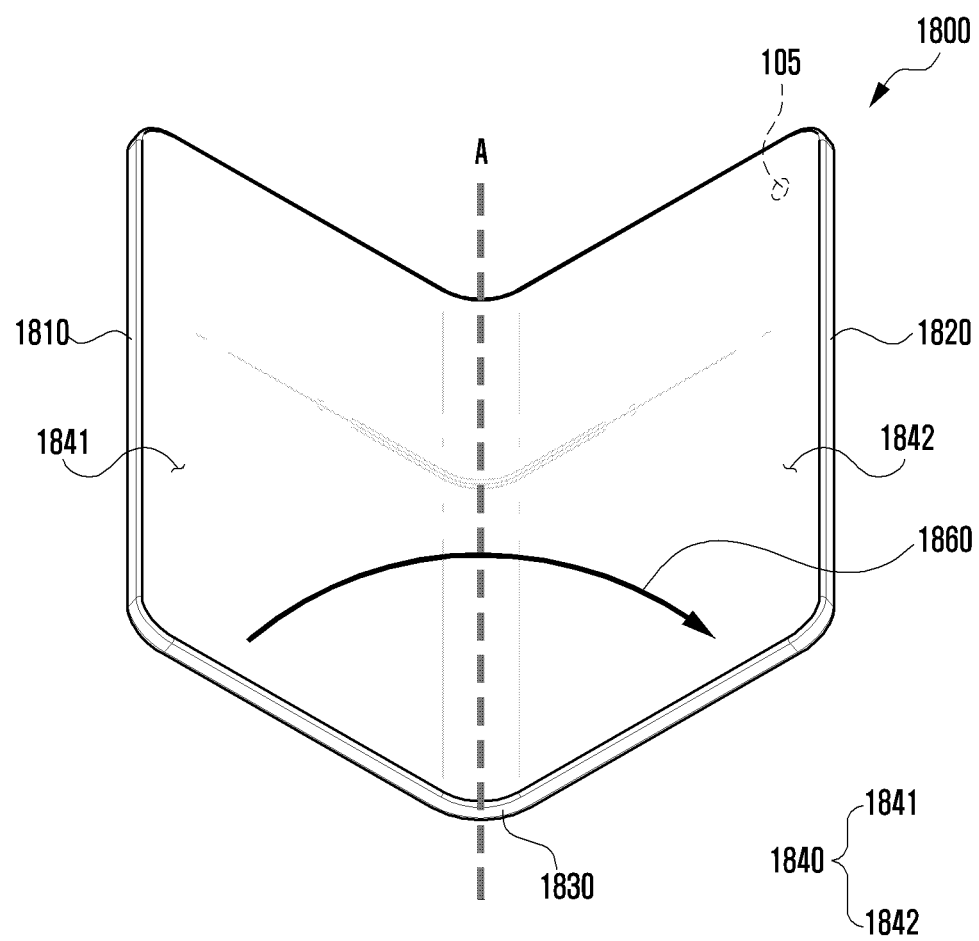
FIG. 18 is a diagram illustrating an example electronic device that is folded by an in-folding type according to various embodiments.
Figure 19:
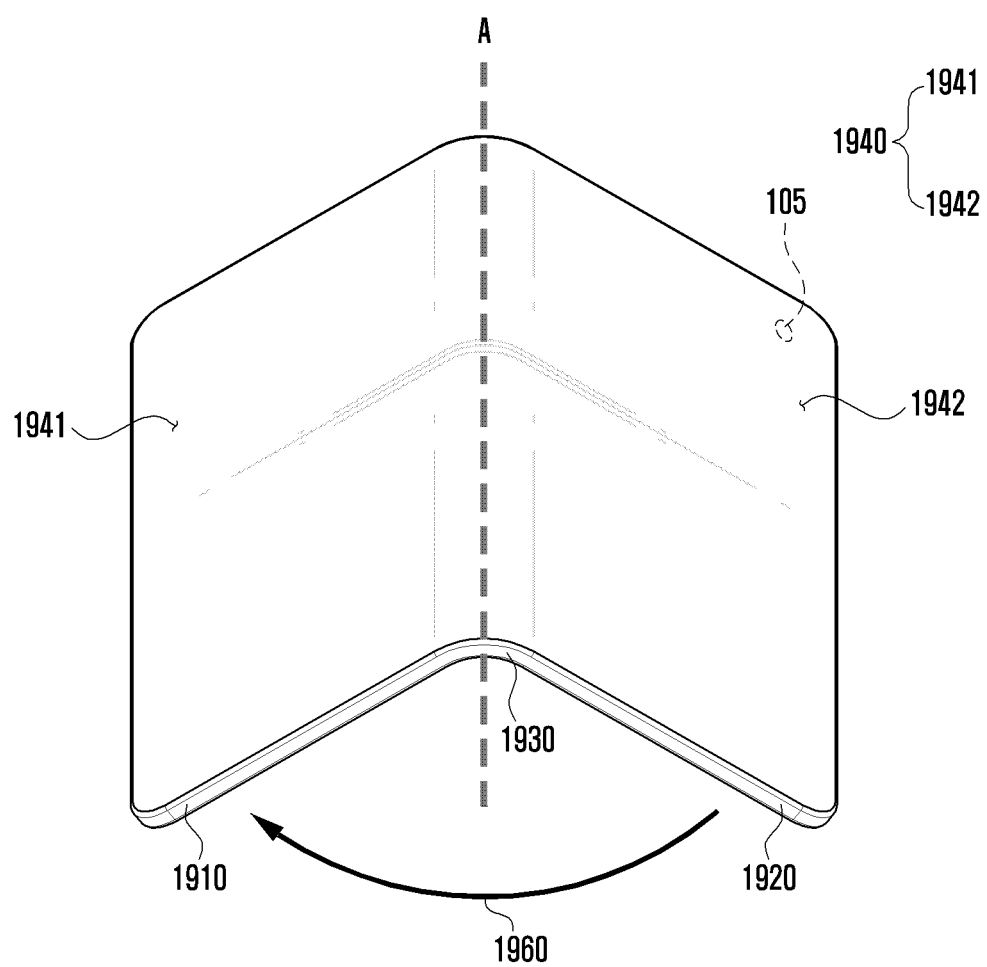
FIG. 19 is a diagram illustrating an example electronic device that is folded by an out-folding type according to various embodiments.

Referring to FIG. 17, the display 400 according to an embodiment may be a flexible display including a flexible substrate 512. The electronic device according to an embodiment may include the flexible display, and may be an electronic device in which at least a portion of the display is foldable as shown in FIG. 18 and FIG. 19 (e.g., the display 1840 in FIG. 18 or the display 1940 in FIG. 19).

Referring to FIG. 17, according to an embodiment, the substrate 512 may include a flexible substrate formed of a colorless and transparent material. For example, the substrate 512 may be a film of a colorless and transparent polymer material. For example, the substrate 512 may include at least one material among polyethylene terephthalate (PET), polyethylene naphthalate (PEN), polyethylene sulfide (PES), polyethylene (PE), and polyimide (PI). According to an embodiment, the LTPS layer 530 may include LTPS or liquid crystal polymer (LCP).

In an embodiment, a protective film 1710 may be attached to the substrate 512 in the second direction z2 therefrom. For example, the protective film 1710 may be polyethylene terephthalate (PET).

In an embodiment, the ultra-thin glass (UTG) 1720 may be attached to the color filter layer 433 in the first direction z1 therefrom. The UTG 1720 may play the role of protecting the display 400 from external impact.

In an embodiment, a window 1730 may be formed as a front cover in the first direction z1 from the UTG 1720. For example, the window 1730 may include a polyimide (PI) material.

FIG. 18 is a diagram illustrating an example electronic device that is folded by an in-folding type according to various embodiments.

Referring to FIG. 18, an electronic device 1800 according to an embodiment may be an electronic device 1800 that is folded about a folding axis A by an in-folding type. For example, the folding axis A may cross the center of the display 1840 in the vertical direction. According to an embodiment not shown, the folding axis A may cross the center of the display 1840 in the horizontal direction.

The electronic device 1800 according to an embodiment may include foldable housings (e.g., a first housing 1810 and a second housing 1820), a hinge assembly 1830 for connecting the first housing 1810 and the second housing 1820 such that the second housing 1820 is rotatable with respect to the first housing 1810, and a flexible or foldable display 1840 disposed in the space formed by the foldable housings 1810 and 1820.

In an embodiment, two or more hinge assemblies 1830 may be disposed to allow the display to be folded in substantially the same direction or in different directions.

In an embodiment, the display 1840 may range from the first housing 1810 to the second housing 1820 across the hinge assembly 1830. The display 1840 may be divided into a first display area 1841 disposed in the inner space of the first housing 1810 and a second display area 1842 disposed in the inner space of the second housing 1820, based on the folding axis A. The hinge assembly 1830 may be implemented by an in-folding type in which the two display areas 1841 and 1842 face each other when the electronic device 1800 converts the state (i.e., the form) thereof from an unfolded state to a folded state. For example, the two display areas 1841 and 1842 may be directed in the same direction when the electronic device 1800 is in the unfolded state, and the two display areas 1841 and 1842 may be rotated in the direction 1860 in which they face each other according to the switching from the unfolded state to the folded state (1860).

In an embodiment, the camera 105 may be disposed on the back surface of (e.g., under) the display 1840. In an embodiment, the structure in which the display and the camera 105 overlap each other may be the same as or similar to the various embodiments described with reference to FIG. 1 to FIG. 17.

FIG. 19 is a diagram illustrating an example electronic device that is folded by an out-folding type according to various embodiments.

Referring to FIG. 19, an electronic device 1900 according to an embodiment may be an electronic device 1900 that is folded about a folding axis A by an out-folding type. For example, the folding axis A may cross the center of the display 1940 in the vertical direction. According to an embodiment not shown, the folding axis A may cross the center of the display 1940 in the horizontal direction.

The electronic device 1900 according to an embodiment may include foldable housings (e.g., a first housing 1910 and a second housing 1920), a hinge assembly 1930, and a display 1940 disposed in the space formed by the foldable housings 1910 and 1920. The display 1940 may be divided into a first display area 1941 disposed in the inner space of the first housing 1910 and a second display area 1942 disposed in the inner space of the second housing 1920, based on the folding axis A.

The hinge assembly 1930 may be implemented by an out-folding type in which the two display areas 1941 and 1942 are directed in opposite directions to each other when the electronic device 1900 converts the state thereof from an unfolded state to a folded state. For example, the two display areas 1941 and 1942 may face in the same direction when the electronic device 1900 is in the unfolded state, and the two display areas 1941 and 1942 may be rotated in the direction in which they are directed in opposite directions to each other according to the switching from the unfolded state to the folded state (1960).

In an embodiment, two or more hinge assemblies 1930 may be disposed to allow the display to be folded in substantially the same direction or in different directions.

In an embodiment, the camera 105 may be disposed on the back surface of (e.g., under) the display 1940. In an embodiment, the structure in which the display and the camera 105 overlap each other may be the same as or similar to the various embodiments described with reference to FIG. 1 to FIG. 17.

Figure 20:
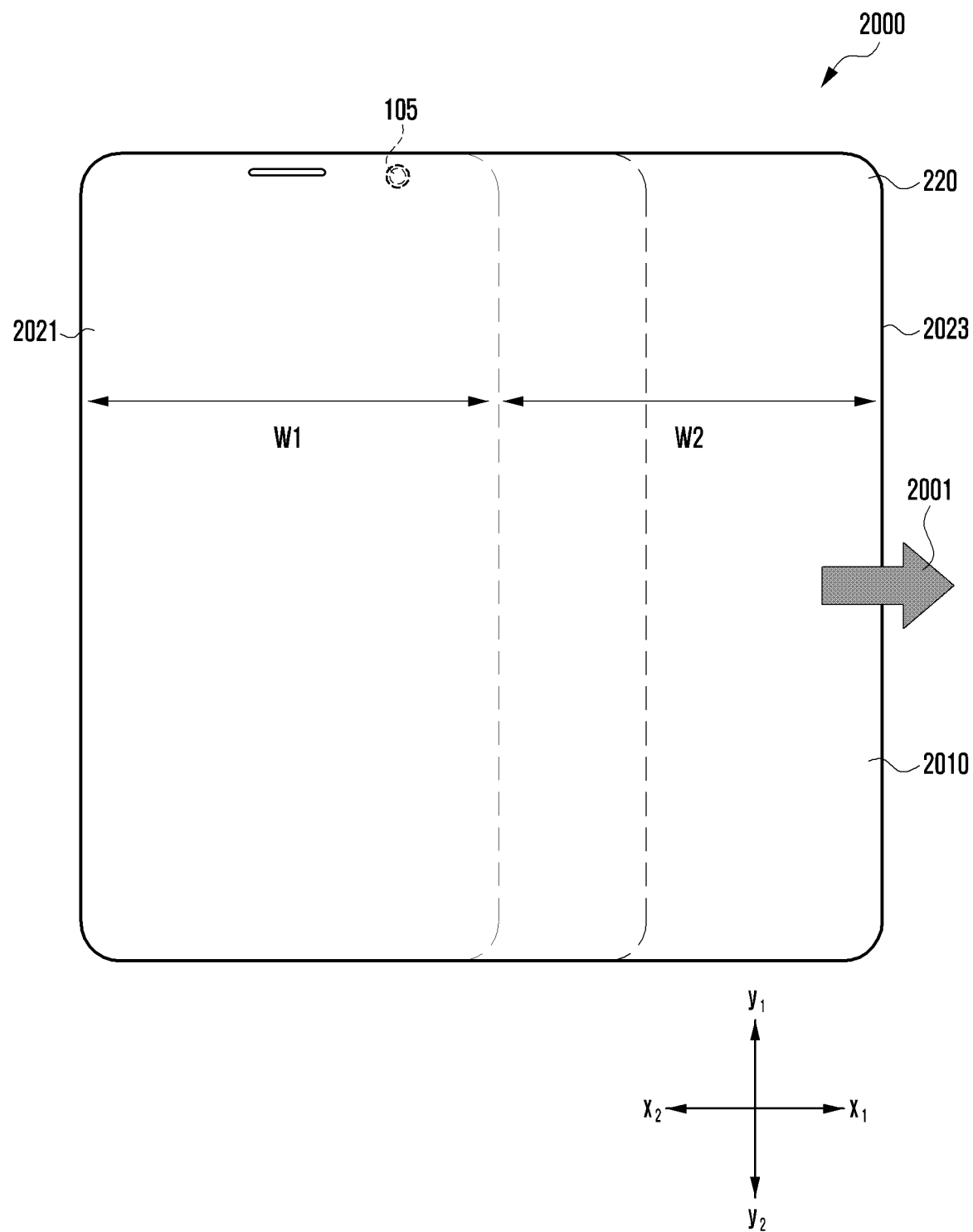
FIG. 20 is a diagram illustrating an example electronic device including a rollable display according to various embodiments.

FIG. 20 is a diagram illustrating an example electronic device including a rollable display according to various embodiments.

Referring to FIG. 20, the electronic device 2000 according to an embodiment may include a rollable display 2010 including a housing 220 of which the length of at least a portion is variable so that the area or width exposed to the outside is adjustable by the variable length of the housing 220.

In an embodiment, the housing 220 may include a first side member 2021 that is fixed, and a second side member 2023 that is located to be movable on the opposite side of the first side member 2021. For example, the first side member 2021 may be disposed in the direction x1 from the display 2010 to then be fixed. For example, the second side member 2023 may be disposed in the direction x2 from the display 2010, and may slide to move in the direction x2. The exposed area or width of the display 2010 may vary with the movement of the second side member 2023 in the direction x2.

According to an embodiment, the display 2010 may include a flexible substrate (e.g., the substrate 512 in FIG. 17), and the exposed width thereof may be adjusted based on the movement of the second side member 2023. For example, as shown by the arrow 2001 in FIG. 20, the second side member 2023 may move in the direction x2, thereby increasing the exposed width of the display. For example, the second side member 2023 may move in the direction x1, thereby reducing the exposed width of the display 2010.

Assuming that the exposed width of the display 2010 is a first width W1 and the maximum width by which the second side member 2023 is able to move in the direction x2 is a second width W2 in the case where the first side member 2021 and the second side member 2023 are closest to each other, the minimum width of the display 2010 and the maximum width of the display 2010 may be as follows.

Minimum width of display 2010: First width W1,

Maximum width of display 2010: Sum of first width W1 and second width W2.

Although it has been described in the illustrated example that the first side member 2021 is fixed and the second side member 2023 is movable in the direction x2, they are not limited thereto, and the first side member 2021 may also be movable. For example, the first side member 2021 may move in the direction x1, and the exposed width of the display 2010 may increase in the direction x1, based on the movement of the first side member 2021.

Although it has been described in the illustrated example that the second side member 2023 is movable in the direction x2, it is not limited thereto, and the second side member 2023 may move in the direction y1 or the direction y2. In this case, the exposed width of the display 2010 may increase in the direction y1 or the direction y2, based on the movement of the second side member 2023.

In an embodiment shown in FIG. 20, a camera 105 may be disposed on the back surface of (e.g., under) the display 2010. For example, the camera 105 may be arranged in the area in which the display 2010 is fixed to be exposed. For example, the position of the camera 105 may be arranged to be fixed regardless of the width of the display 2010. In an embodiment, the structure in which the display 2010 and the camera 105 overlap each other may be the same as or similar to the various embodiments described with reference to FIG. 1 to FIG. 17.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:
   a housing;
   a display viewable through a portion of the housing; and
   a camera overlapping the display and configured to photograph external light passing through the display,
   wherein the display comprises: a colorless and transparent substrate, a pixel layer disposed in a first direction from the substrate and comprising organic light-emitting diode (OLED) type pixels, an organic encapsulation layer disposed in the first direction from the pixel layer, and a color filter layer disposed in the first direction from the organic encapsulation layer,
   wherein the display comprises: a first area overlapping at least a portion of the camera and a second area not overlapping the camera,
   wherein an arrangement density of a first group of pixels in the first area is lower than an arrangement density of a second group of pixels in the second area, and
   wherein the color filter layer comprises first color filters overlapping the pixels of the first group, second color filters overlapping the pixels of the second group, a black matrix disposed between the second color filters in the second area, and a transmission area disposed between the first color filters in the first area.

2. The electronic device according to claim 1, wherein the substrate comprises colorless and transparent glass.

3. The electronic device according to claim 1, wherein the substrate comprises a colorless, transparent, and flexible substrate.

4. The electronic device according to claim 1, wherein the display does not include a polarizer.

5. The electronic device according to claim 1, wherein an air layer is not disposed between the pixel layer and the organic encapsulation layer.

6. The electronic device according to claim 1, wherein the organic encapsulation layer comprises a first inorganic layer, an organic layer, and a second inorganic layer, which are disposed in order in the first direction.

7. The electronic device according to claim 1, wherein the substrate and the organic encapsulation layer contact each other in an area between the pixels of the first group.

8. The electronic device according to claim 1, wherein a surface of the organic encapsulation layer disposed in the first area is substantially even.

9. The electronic device according to claim 1, wherein a surface of the organic encapsulation layer is substantially even from the first area to the second area.

10. The electronic device according to claim 1, wherein the organic layer has a first variation in height in the first area, and the organic layer has a second variation in height in the second area, the second variation in height being is less than the first variation in height.

11. The electronic device according to claim 1, wherein in the first area, the organic layer has a first height in an area corresponding to the pixels of the first group, and the organic layer has a second height greater than the first height in an area between the pixels of the first group.

12. The electronic device according to claim 1, wherein the color filter layer further comprises third color filters disposed in the transmission area, and
   wherein an area of the third color filters is less than the area of the first color filters and is less than the area of the second color filters.

13. The electronic device according to claims 1, wherein the color filter layer further comprises a second black matrix arranged irregularly between the third color filters in the transmission area.

14. A display for a camera configured to photograph external light passing through the display, the display comprising:
   a colorless and transparent substrate;
   a pixel layer disposed in a first direction from the substrate and comprising organic light-emitting diode (OLED) type pixels;
   an organic encapsulation layer disposed in the first direction from the pixel layer;
   a color filter layer disposed in the first direction from the organic encapsulation layer;
   a first area overlapping at least a portion of the camera; and
   a second area that not overlapping the camera,
   wherein an arrangement density of a first group of pixels in the first area is lower than an arrangement density of a second group of pixels in the second area, and
   wherein the color filter layer comprises first color filters overlapping the pixels of the first group, second color filters overlapping the pixels of the second group, a black matrix disposed between the second color filters in the second area, and a transmission area disposed between the first color filters in the first area.

15. The display according to claim 14, wherein the organic encapsulation layer comprises a first inorganic layer, an organic layer, and a second inorganic layer disposed in order in the first direction.

16. The display according to claim 14, wherein the substrate and the organic encapsulation layer contact each other in an area between the pixels overlapping the camera.

17. The display according to claim 14, wherein a surface of the organic encapsulation layer in the first area is substantially even.

18. The display according to claim 14, wherein the organic layer has a first variation in height in the first area, and the organic layer has a second variation in height in the second area, is the second variation in height being less than the first variation.

19. The display according to claim 14, wherein a surface of the organic encapsulation layer is substantially even from the first area to the second area.

20. The display according to claim 14, wherein in the first area, the organic layer has a first height in an area corresponding to the pixels of the first group, and the organic layer has a second height greater than the first height in an area between the pixels of the first group.

* * * * *